(12) United States Patent
Youn et al.

(10) Patent No.: US 10,347,702 B2
(45) Date of Patent: Jul. 9, 2019

(54) FLEXIBLE THIN FILM TRANSISTOR SUBSTRATE AND FLEXIBLE ORGANIC LIGHT EMITTING DISPLAY DEVICE

(71) Applicant: LG Display Co., Ltd., Seoul (KR)

(72) Inventors: Sangcheon Youn, Seoul (KR); NackBong Choi, Goyang-si (KR); YoonDong Cho, Gwangmyeong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/877,486

(22) Filed: Oct. 7, 2015

(65) Prior Publication Data

US 2016/0118451 A1 Apr. 28, 2016

(30) Foreign Application Priority Data

Oct. 22, 2014 (KR) .................. 10-2014-0143117
Nov. 7, 2014 (KR) .................. 10-2014-0154435

(51) Int. Cl.
*H01L 27/12* (2006.01)
*H01L 27/32* (2006.01)
*H01L 29/423* (2006.01)
*H01L 29/786* (2006.01)

(52) U.S. Cl.
CPC ...... *H01L 27/3262* (2013.01); *H01L 27/1218* (2013.01); *H01L 27/1248* (2013.01); *H01L 27/3258* (2013.01); *H01L 29/42384* (2013.01); *H01L 29/78603* (2013.01); *H01L 29/78606* (2013.01); *H01L 27/3276* (2013.01); *H01L 2029/42388* (2013.01); *H01L 2251/5338* (2013.01)

(58) Field of Classification Search
CPC ............ H01L 27/3262; H01L 27/1218; H01L 27/3246; H01L 27/3248; H01L 27/3258; H01L 27/3276; H01L 2251/5338; H01L 51/52; H01L 51/0097; H01L 27/1248
See application file for complete search history.

(56) References Cited

U.S. PATENT DOCUMENTS 7,242,398 B2* 7/2007 Nathan ............... H01L 27/3244
 345/206
7,638,803 B2* 12/2009 Park ................... H01L 51/5237
 257/59
7,960,742 B2* 6/2011 Chou ................ G02F 1/136227
 257/83
9,201,265 B2* 12/2015 Park ................. G02F 1/133528
(Continued)

*Primary Examiner* — Meiya Li
*Assistant Examiner* — Shih Tsun A Chou
(74) *Attorney, Agent, or Firm* — Fenwick & West LLP

(57) ABSTRACT

Provided are a flexible thin film transistor substrate and a flexible organic light emitting display device. The flexible thin film transistor substrate includes: a flexible substrate including at least one thin film transistor (TFT) area and having flexibility, an active layer disposed in the TFT area on the flexible substrate, a gate insulation layer disposed on the active layer, a gate electrode overlapping with the active layer on the gate insulation layer, an insulating interlayer disposed on the gate electrode, and a source electrode and a drain electrode disposed on the insulating interlayer and connected with the active layer, respectively. The gate insulation layer or the insulating interlayer includes at least one hole pattern configured to reduce bending stress.

10 Claims, 19 Drawing Sheets

(56) References Cited

U.S. PATENT DOCUMENTS

| | | | |
|---|---|---|---|
| 9,214,640 B2* | 12/2015 | Lee | H01L 51/0097 |
| 9,570,524 B2* | 2/2017 | Lee | H01L 27/3246 |
| 2001/0040645 A1* | 11/2001 | Yamazaki | G02F 1/133305 |
| | | | 349/42 |
| 2006/0078671 A1* | 4/2006 | Lee | H01L 27/1214 |
| | | | 427/66 |
| 2006/0289866 A1* | 12/2006 | Araki | G02F 1/136227 |
| | | | 257/59 |
| 2007/0090420 A1* | 4/2007 | Chu | G02F 1/136286 |
| | | | 257/291 |
| 2012/0061664 A1* | 3/2012 | Yamazaki | H01L 27/1225 |
| | | | 257/43 |
| 2013/0069085 A1* | 3/2013 | Kang | H01L 51/5246 |
| | | | 257/88 |
| 2013/0092910 A1* | 4/2013 | Seo | H01L 51/0052 |
| | | | 257/40 |
| 2013/0240888 A1* | 9/2013 | Cho | H01L 27/1266 |
| | | | 257/59 |
| 2013/0248867 A1* | 9/2013 | Kim | H01L 51/5253 |
| | | | 257/59 |
| 2014/0021499 A1* | 1/2014 | Jang | H01L 51/0097 |
| | | | 257/98 |
| 2014/0159046 A1* | 6/2014 | Deng | H01L 27/1218 |
| | | | 257/72 |
| 2014/0231763 A1* | 8/2014 | Kim | H01L 27/3218 |
| | | | 257/40 |
| 2014/0367658 A1* | 12/2014 | Kwak | H01L 23/562 |
| | | | 257/40 |
| 2015/0028303 A1* | 1/2015 | Kim | H01L 51/5237 |
| | | | 257/40 |
| 2015/0036299 A1* | 2/2015 | Namkung | G02F 1/133345 |
| | | | 361/749 |
| 2015/0041769 A1* | 2/2015 | Kim | H01L 51/0097 |
| | | | 257/40 |
| 2015/0060778 A1* | 3/2015 | Kim | H01L 27/3258 |
| | | | 257/40 |
| 2015/0108484 A1* | 4/2015 | Park | H01L 27/1255 |
| | | | 257/71 |
| 2015/0162251 A1* | 6/2015 | Jeong | H01L 27/124 |
| | | | 257/48 |
| 2015/0162377 A1* | 6/2015 | Lee | H01L 29/786 |
| | | | 257/72 |
| 2015/0194628 A1* | 7/2015 | Kwak | H01L 51/5253 |
| | | | 257/40 |
| 2015/0194630 A1* | 7/2015 | Hirai | H01L 51/5253 |
| | | | 257/40 |
| 2015/0236045 A1* | 8/2015 | Im | H01L 27/124 |
| | | | 257/72 |
| 2016/0064691 A1* | 3/2016 | Lee | H01L 27/3248 |
| | | | 257/40 |

* cited by examiner

FLEXIBLE THIN FILM TRANSISTOR SUBSTRATE AND FLEXIBLE ORGANIC LIGHT EMITTING DISPLAY DEVICE

CROSS-REFERENCE TO RELATED APPLICATIONS

This application claims the priority of Korean Patent Application No. 10-2014-0143117 filed on Oct. 22, 2014, and Korean Patent Application No. 10-2014-0154435 filed on Nov. 7, 2014 in the Korean Intellectual Property Office, the disclosure of which are each incorporated herein by reference.

BACKGROUND

Field

The present disclosure relates to a flexible thin film transistor substrate and a flexible organic light emitting display device, and more particularly, to a flexible thin film transistor substrate and a flexible organic light emitting display device in which performance does not deteriorate in spite of repeated folding.

Description of the Related Art

In a display device used in a monitor of a computer, a television (TV), or a mobile phone, an organic light emitting display device self-emitting light, a plasma display panel (PDP) and the like, and a liquid crystal display (LCD) requiring a separate light source, and the like are included.

Further, recently, a flexible display device manufactured by forming pixels, lines, and the like on a flexible substrate such as plastic which is a flexible material to display an image even though being bent like a paper has received attention as a next-generation display device.

Particularly, an organic light emitting element has received attention as a pixel of the flexible display device due to a small thickness and excellent flexibility. A flexible organic light emitting display device includes an organic light emitting element and a thin film transistor turning on or off the organic light emitting element. Furthermore, the flexible organic light emitting display device includes an inorganic insulation layer insulating electrodes of the thin film transistor from each other and an organic insulation layer disposed on the inorganic insulation layer. However, when the flexible organic light emitting display device is repetitively bent or folded, tension is applied to the inorganic insulation layer and the organic insulation layer included in the flexible organic light emitting display device. As a result, a crack may be generated in the inorganic insulation layer or the organic insulation layer. The crack may propagate to the organic light emission layer of the organic light emitting element or the active layer of the thin film transistor through the inorganic insulation layer and the organic insulation layer. As a result, performance of the organic light emission layer or the active layer may deteriorate. For example, tension generated by bending breaks bond between the inorganic insulation layer and the active layer. Thus, a phenomenon that the active layer slips over the inorganic insulation layer due to breaking the bond there between may occur. Herein this phenomenon is defined to slip phenomenon. The crack and the slip phenomenon between the active layer of the thin film transistor and the inorganic insulation layer shift a threshold voltage of the thin film transistor, and the lifespan of the flexible organic light emitting display device may be shortened.

SUMMARY

When a crack between the active layer of the thin film transistor and the inorganic insulation layer occurs and a slip phenomenon occurs where the active layer slips over the inorganic insulation layer due to breaking bonding there between are generated, a characteristic of the thin film transistor may deteriorate while charge trap sites are increased in an interface between the active layer and the inorganic insulation layer. Accordingly, various studies were conducted for a structure of the thin film transistor so as not to generate the crack and the slip phenomenon in the interface between the active layer and the inorganic insulation layer. A flexible thin film transistor substrate and a flexible organic light emitting display device including a hole pattern is disclosed that protects the active layer from the crack and the slip phenomenon by patterning the inorganic insulation layer contacting the active layer of the thin film transistor.

Furthermore, characteristics of the organic light emitting element and the thin film transistor deteriorate as the crack generated in the organic insulation layer is propagated to the organic light emission layer or the active layer. Thus, an organic light emitting display device having a structure capable of minimizing generation of the crack in the organic insulation layer and suppressing the crack already generated in the organic insulation layer from being propagated to the organic light emission layer or the active layer is disclosed.

Thus, an object of the present disclosure is to provide a flexible thin film transistor substrate and a flexible organic light emitting display device which minimize generation of cracks in an organic insulation layer and an inorganic insulation layer and suppress the crack generated in the organic insulation layer or the inorganic insulation layer from being propagated to the organic light emission layer or the active layer by forming a hole pattern in at least one insulation layer of the organic insulation layer and the inorganic insulation layer.

Another object of the present disclosure is to provide a flexible thin film transistor substrate and a flexible organic light emitting display device in which deterioration of the thin film transistor is not generated well in spite of folding (or bending) of the flexible organic light emitting display device in various directions, by isolating the thin film transistor of the flexible organic light emitting display device by using a hole pattern.

The objects of the present disclosure are not limited to the aforementioned objects, and other objects, which are not mentioned above, will be apparent to a person having ordinary skill in the art from the following description.

According to an exemplary embodiment of the present disclosure, there is provided a flexible thin film transistor substrate. The flexible thin film transistor substrate includes: a flexible substrate including at least one thin film transistor (TFT) area and having flexibility, an active layer disposed in the TFT area on the flexible substrate, a gate insulation layer disposed on the active layer, a gate electrode overlapping with the active layer on the gate insulation layer, an insulating interlayer disposed on the gate electrode, and a source electrode and a drain electrode disposed on the insulating interlayer and connected with the active layer, respectively. The gate insulation layer or the insulating interlayer includes at least one hole pattern disposed outside the TFT area. The hole pattern is configured to reduce bending stress generated by bending the flexible substrate. The flexible thin film transistor substrate according to the exemplary embodiment of the present disclosure includes hole patterns which separate the active layers from each other, so that tension generated due to folding is distributed and a crack generated due to folding can be suppressed from being propagated to an interface between the active layer and the gate insulation layer. Thus, a characteristic of the thin film transistor of the flexible thin film transistor substrate can be maintained in spite of repeated folding.

According to another feature of the present disclosure, the hole pattern may be extended in a direction parallel to a folding line in which the flexible substrate is folded.

According to yet another feature of the present disclosure, the hole pattern may surround the TFT area.

According to still another feature of the present disclosure, the hole patterns may be disposed in both the gate insulation layer and the insulating interlayer, and the hole pattern of the insulating interlayer may correspond to the hole pattern of the gate insulation layer.

According to still another feature of the present disclosure, the flexible thin film transistor substrate may further include a passivation layer covering the insulating interlayer, the source electrode, and the drain electrode.

According to still another feature of the present disclosure, the passivation layer may include a hole pattern corresponding to the hole pattern of the insulating interlayer.

According to still another feature of the present disclosure, the gate insulation layer, the insulating interlayer, and the passivation layer may be inorganic insulation layers.

According to another exemplary embodiment of the present disclosure, there is provided a flexible organic light emitting display device. The flexible organic light emitting display device includes: a flexible substrate having a pixel area including a plurality of sub pixel areas; a planarization layer disposed on the flexible substrate; a first electrode disposed on the planarization layer; a bank layer disposed to cover an edge of the first electrode; an organic light emission layer disposed on the first electrode; and a second electrode disposed on the organic light emission layer, in which a hole pattern is formed in at least one of the planarization layer and the bank layer, and at least one of the planarization layer and the bank layer is separately disposed on the flexible substrate by the hole pattern. The flexible organic light emitting display device according to the exemplary embodiment of the present disclosure has an advantage of suppressing cracks from being generated in the planarization layer and the bank layer.

According to another feature of the present disclosure, only the planarization layer of the planarization layer and the bank layer may be separately disposed on the flexible substrate.

According to yet another feature of the present disclosure, the bank layer may fill the hole pattern.

According to still another feature of the present disclosure, both the planarization layer and the bank layer may be separately disposed on the flexible substrate.

According to still another feature of the present disclosure, only the bank layer of the planarization layer and the bank layer may be separately disposed on the flexible substrate.

According to still another feature of the present disclosure, a minimum width of the hole pattern may be 1 μm to 50 μm.

According to still another feature of the present disclosure, the planarization layer may be made of photosensitive photo acryl or photosensitive polyimide.

According to still another feature of the present disclosure, the bank layer may be made of polyimide, photo acryl, or benzocyclobutene (BCB).

According to still another feature of the present disclosure, the hole pattern may be extended to form a mesh pattern.

According to another exemplary embodiment of the present disclosure, there is provided a flexible organic light emitting display device including a flexible substrate, an inorganic insulation layer, an organic insulation layer, and an organic light emitting element. A thin film transistor is disposed on the flexible substrate. The inorganic insulation layer is disposed on the flexible substrate. The organic insulation layer is disposed on the inorganic insulation layer. The organic light emitting element is electrically connected with the thin film transistor. At least one of the organic insulation layer and the inorganic insulation layer includes a hole pattern, and the hole pattern minimizes the probability of cracks being generated due to bending of the flexible substrate and suppresses propagation of the cracks.

According to another feature of the present disclosure, the thin film transistor may include an active layer, a gate electrode separated from the active layer and overlapped with the active layer, and a source electrode and a drain electrode electrically connected with the active layer. The inorganic insulation layer may include a gate insulation layer insulating the active layer from the gate electrode of the thin film transistor, an insulating interlayer insulating the source electrode and the drain electrode from the gate electrode, respectively, and a passivation layer covering the thin film transistor. The hole pattern may be disposed in at least one of the gate insulation layer, the insulating interlayer, and the passivation layer.

According to yet another feature of the present disclosure, the thin film transistor may be disposed in a circuit area of the flexible substrate, the organic light emitting element may be disposed in a display area of the flexible substrate, and the hole pattern may be disposed on a boundary where the display area and the circuit area contact each other.

According to still another feature of the present disclosure, the flexible organic light emitting display device may further include a gate line disposed in the circuit area and connected with the gate electrode of the thin film transistor. The hole pattern may be spaced apart from the gate line and extended in parallel with the gate line.

According to still another feature of the present disclosure, the flexible organic light emitting display device may further include a data line disposed in the circuit area and connected with the source electrode or the drain electrode of the thin film transistor. The hole pattern may be spaced apart from the data line and extended in parallel with the data line.

According to still another feature of the present disclosure, the organic light emitting element may include a first electrode connected with the thin film transistor, an organic light emission layer disposed on the first electrode, and a second electrode disposed on the organic light emission layer. The organic insulation layer may include a planarization layer covering the thin film transistor and planarizing an upper surface of the flexible substrate and a bank layer disposed to cover an edge of the first electrode. The hole pattern may be disposed on at least one of the planarization layer and bank layer.

According to still another feature of the present disclosure, the flexible substrate may have a sub pixel area disposed with the organic light emitting element and a pixel area including the sub pixel area. The hole pattern may be disposed to surround the sub pixel area.

According to still another feature of the present disclosure, the flexible substrate may have a sub pixel area disposed with the organic light emitting element and a pixel area including the sub pixel area. The hole pattern may be disposed to surround the pixel area.

Details of other exemplary embodiments will be included in the detailed description of the disclosure and the accompanying drawings.

According to the present disclosure, the hole pattern is formed in the gate insulation layer or the insulating interlayer contacting the active layer of the thin film transistor, and thus, it is possible to suppress a crack generated due to folding from being propagated to an interface between the active layer and the gate insulation layer or an interface between the active layer and the insulating interlayer and suppress a slip phenomenon from being generated due to folding in the interface between the active layer and the gate insulation layer or the interface between the active layer and the insulating interlayer.

According to the present disclosure, the active layer of the thin film transistor is isolated by the hole pattern, and thus, even though the flexible organic light emitting display device is folded in various directions, deterioration of the thin film transistor is not generated well.

Furthermore, according to the present disclosure, a problem of shifting a threshold voltage of the thin film transistor due to bending is not generated, and thus, it is possible to improve the lifespan of the flexible organic light emitting display device.

Furthermore, according to the present disclosure, it is possible to minimize the generation of a crack in the planarization layer and the bank layer due to repeated bending. Also, it is possible to block the crack inevitably generated in the planarization layer or the bank layer from propagating to the organic light emission layer or the thin film transistor.

The effects of the present disclosure are not limited to the aforementioned effects, and other various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
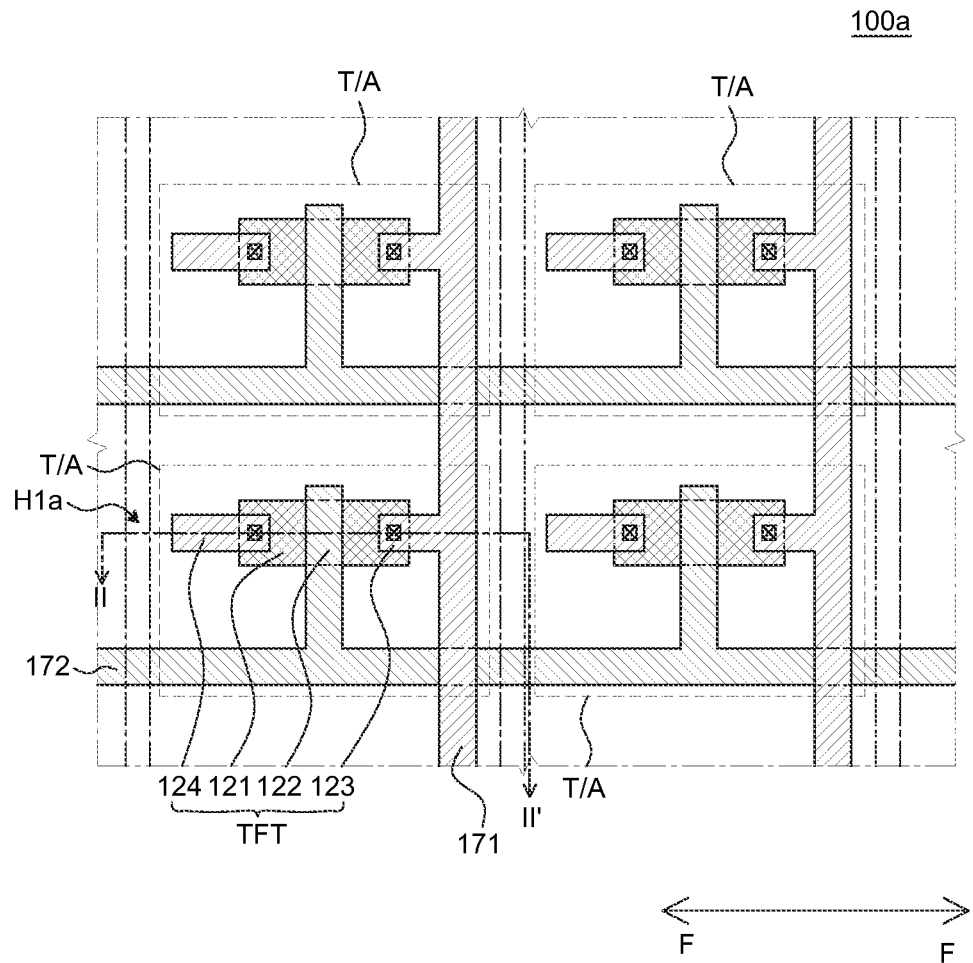
FIG. 1 is a schematic plan view of a flexible thin film transistor substrate according to an exemplary embodiment of the present disclosure.

Various advantages and features of the present disclosure and methods accomplishing thereof will become apparent from the following description of exemplary embodiments with reference to the accompanying drawings. However, the present disclosure is not limited to exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like shown in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", "next" and the like, one or more parts may be positioned between the two parts unless the terms are used with the term. "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

Hereinafter, exemplary embodiments of the present disclosure will be described in detail with reference to the accompanying drawings.

Figure 2A:
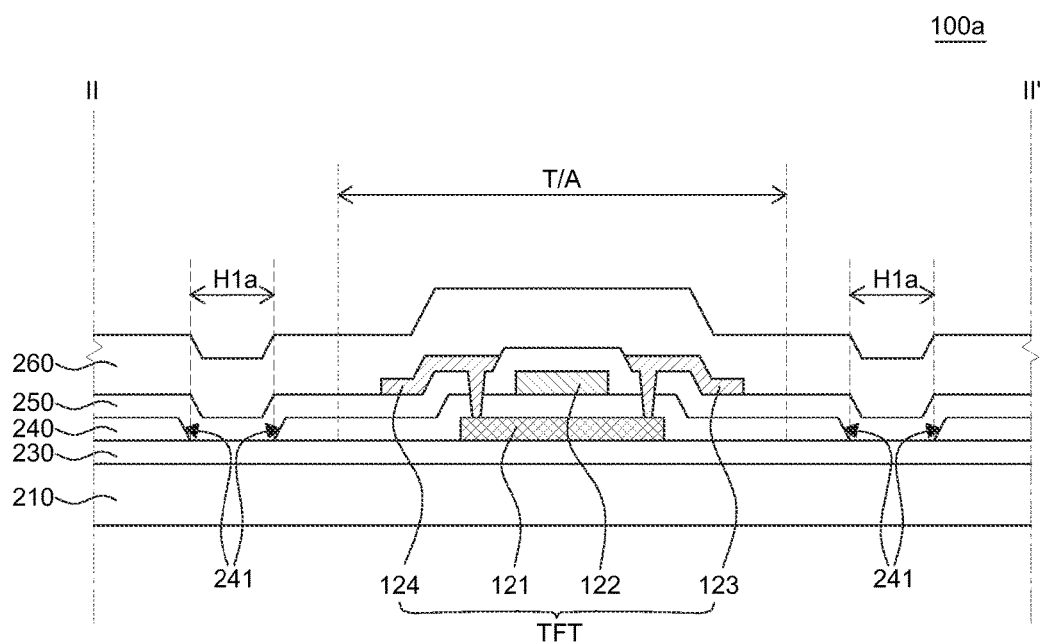
FIG. 2A is a schematic cross-sectional view of the flexible thin film transistor substrate taken along line II-II' of FIG. 1.

FIG. 1 is a schematic plan view of a flexible thin film transistor substrate according to an exemplary embodiment of the present disclosure. FIG. 2A is a schematic cross-sectional view of the flexible thin film transistor substrate taken along line II-II' of FIG. 1. In FIGS. 1 and 2A, for convenience of description, a size and a thickness of a thin film transistor are schematically illustrated. Referring to FIGS. 1 and 2A, a flexible thin film transistor substrate 100a includes a flexible substrate 210 and a thin film transistor TFT.

The flexible thin film transistor substrate 100a is applied as substrates of various electronic devices. For example, the flexible thin film transistor substrate 100a may be applied to various display devices such as an organic light emitting display device, a liquid crystal display device, a plasma display device, an electrophoretic display device (EPD), and an electrowetting display device (EWD).

The flexible substrate 210 is a substrate for supporting various constituent elements of the flexible thin film transistor substrate 100a and the flexible substrate 210 has flexibility. The flexible substrate 210 may be a film form including one selected from a group consisting of polyimide-based polymers, polyester-based polymers, silicon-based polymers, acrylic polymers, polyolefin-based polymers, and copolymers thereof. In some exemplary embodiments, in the case where a display device using the flexible thin film transistor substrate 100a is implemented as a transparent flexible display device, the flexible substrate 210 may be made of a transparent flexible material.

The flexible substrate 210 includes at least one thin film transistor area T/A. The thin film transistor TFT is disposed in the thin film transistor area T/A. The thin film transistor area T/A may be disposed in a matrix form in the flexible substrate 210. For convenience of description, in FIG. 1, only four thin film transistor areas T/A are illustrated, but the number of thin film transistor areas T/A is not limited thereto.

The flexible substrate 210 may be folded (that is, bent) in a predetermined direction. A direction in which the flexible substrate 210 is folded is defined as a folding direction F, and in FIG. 1, the folding direction F is illustrated by an arrow. For example, the flexible substrate 210 may be folded in a horizontal direction. In this case, a right side of the flexible substrate 210 may be folded to a left side based on FIG. 1, and on the contrary, the left side of the flexible substrate 210 may be folded to the right side. However, the folding direction F is a predetermined direction for convenience of description, and the flexible substrate 210 may be folded in a vertical direction or an oblique direction.

A buffer layer 230 is disposed on the flexible substrate 210. The buffer layer 230 suppresses moisture or impurities from penetrating through the flexible substrate 210 and may planarize a surface of the flexible substrate 210. However, the buffer layer 230 is not a necessary configuration and may be adopted according to a kind of flexible substrate 210 or a kind of thin film transistor TFT used in the flexible thin film transistor substrate 100a. As illustrated in FIG. 2A, when the buffer layer 230 is used, the buffer layer 230 may be made of an inorganic material such as silicon oxide (SiOx), silicon nitride (SiNx), and aluminum oxide (AlOx), or an organic material such as acryl and polyimide.

The thin film transistor TFT is disposed on the buffer layer 230 in the thin film transistor area T/A. The thin film transistor TFT includes an active layer 121, a gate electrode 122, a source electrode 123, and a drain electrode 124. In the case where the flexible thin film transistor substrate 100a is applied to the display device, the thin film transistor TFT turns on or off pixels of the display device. Hereinafter, respective constituent elements of the thin film transistor TFT will be described in detail.

The active layer 121 is disposed on the buffer 230 in the thin film transistor area T/A. The active layer 121 may include a channel region in which a channel is formed, and a source region and a drain region which are connected with a source electrode 123 and a drain electrode 124, respectively. The active layer 121 may be made of silicon (Si), silicon containing impurities, amorphous silicon (α-Si), amorphous silicon containing impurities, polysilicon (poly-Si), polysilicon containing impurities, and oxide semiconductor.

A gate insulation layer 240 is disposed on the active layer 121. The gate insulation layer 240 insulates the gate electrode 123 from the active layer 121. The gate insulation layer 240 may cover the entire surface of the flexible substrate 210 including the active layer 121 as illustrated in FIG. 2A. In some exemplary embodiments, since the gate insulation layer 240 insulates the gate electrode 123 from the active layer 121, the gate insulation layer 240 may be disposed only on the active layer 121. The gate insulation layer 240 may be formed of silicon oxide, silicon nitride, or a plurality of layers thereof, but is not limited thereto and may be formed of various materials.

The gate electrode 122 overlaps with at least a part of the active layer 121 on the gate insulation layer 240. For example, the gate electrode 122 overlaps with the channel region of the active layer 121. The gate electrode 122 may be made of any one of molybdenum (Mo), aluminum (Al), chromium (Cr), gold (Au), titanium (Ti), nickel (Ni), neodymium (Nd), and copper (Cu), or an alloy thereof, but is not limited thereto and may be made of various materials. The gate electrode 122 may be formed by a single-layered or multilayered structure including the aforementioned materials.

A gate line 172 is connected with the gate electrode 121 of the thin film transistor TFT. The gate line 172 may be extended in a predetermined direction. For example, as illustrated in FIG. 1, the gate line 172 may be extended in a horizontal direction. Even though the gate line 172 illustrated in FIG. 1 is extended in a straight form, the gate line 172 may be extended in a curved or zigzag form. The gate line 172 is disposed on the same layer as the gate electrode 121 and may be extended from the gate electrode 121. The gate line 172 may be made of the same material as the gate electrode 122.

An insulating interlayer 250 is disposed on the gate electrode 122. For example, the insulating interlayer 250 may cover both the gate electrode 122 and the gate insulation layer 240. The insulating interlayer 250 may be formed of silicon oxide, silicon nitride, or a plurality of layers thereof like the gate insulation layer 240, but is not limited thereto and may be formed of various materials.

The source electrode 123 and the drain electrode 124 are disposed on the insulating interlayer 250 and electrically connected with the active layer 121. For example, the source electrode 121 and the drain electrode 124 may be electrically connected with the source region and the drain region of the active layer 121 through a contact hole of the insulating interlayer 250 and/or the gate insulation layer 240, respectively. The source electrode 123 and the drain electrode 124 may be made of any one of molybdenum, aluminum, chromium, gold, titanium, nickel, and neodymium, and copper, or an alloy thereof, but are not limited thereto and may be made of various materials. The source electrode 123 and the drain electrode 124 may be formed by a single-layered or multilayered structure including the aforementioned materials.

A data line 171 is connected with the source electrode 123 or the drain electrode 124 of the thin film transistor TFT. For example, the data line 171 is connected with the source electrode 123 of the thin film transistor TFT as illustrated in FIG. 1. The data line 171 is extended in a different direction from the gate line 171. For example, the data line 171 is extended in a vertical direction to the gate line 172. Even though the data line 171 illustrated in FIG. 1 is extended in a straight form, the data line 171 may be extended in a curved or zigzag form. The data line 171 is disposed on the same layer as the source electrode 123 and may be extended from the source electrode 123. The data line 171 may be made of the same material as the source electrode 123.

A passivation layer 260 covers the insulating interlayer 250, the source electrode 123, and a drain electrode 124. The passivation layer 260 is a protective layer that may be formed with the same material as the insulating interlayer 250 and/or the gate insulation layer 240. For example, the insulating interlayer 250 may be formed by a single-layered or multilayered structure configured by one of materials such as silicon oxide and silicon nitride, but is not limited thereto and may be formed of various materials. However, the passivation layer 260 is not necessarily required, and in some exemplary embodiments, the passivation layer 260 may be omitted.

A hole pattern H1a is disposed outside the thin film transistor area T/A. For example, as illustrated in FIG. 1, the hole pattern H1a is disposed between adjacent thin film transistor areas T/A. The hole pattern H1a is extended in a different direction from the folding direction F. For example, as illustrated in FIG. 1, the hole pattern H1a is extended in a vertical direction to the folding direction F. That is, the hole pattern H1a is extended in a parallel direction with the data line 171. The hole pattern H1a is disposed and spaced apart from the data line 171 by a predetermined distance. For example, the hole pattern H1a may be spaced apart from the data line 171 by about 2 μm or more. However, the distance between the hole pattern H1a and the data line 171 is not limited thereto. Even though the hole pattern H1a illustrated in FIG. 1 is extended in a straight form, the hole pattern H1a may be extended in a curved or zigzag form.

The hole pattern H1a is disposed in at least one of inorganic insulation layers of the flexible thin film transistor substrate 100a. That is, the hole pattern H1a is disposed in the gate insulation layer 240 or the insulating interlayer 250. For example, as illustrated in FIG. 2A, the hole pattern H1a is disposed in the gate insulation layer 240. When the gate insulation layer 240 is disposed only on the channel region of the active layer 121, the hole pattern H1a may be disposed in the insulating interlayer 250. In FIG. 2A, the hole pattern H1a disposed in the gate insulation layer 240 is illustrated. The hole pattern H1a may be formed by removing a part of the gate insulation layer 240. For example, the part of the gate insulation layer 240 may be removed through a photolithography process. Accordingly, a side surface 241 corresponding to the hole pattern H1a is formed on the gate insulation layer 240. As illustrated in FIG. 2A, the side surface 241 of the gate insulation layer 240 may be obliquely formed. The width of the hole pattern H1a may be minimally about 1 μm to 50 μm. For example, the width of the hole pattern H1a may be about 3 μm or more. However, the width of the hole pattern H1a is not limited thereto.

The hole patterns H1a separate respective active layers 121 disposed in a plurality of thin film transistor areas T/A from each other. That is, since the hole patterns H1a are disposed between the adjacent thin film transistor areas T/A, the active layers 121 which are adjacent to each other by the hole patterns H1a may be separated from each other. Since the hole patterns H1a separate the active layers 121 from each other, deterioration of the active layer due to the folding may be suppressed.

As described above, since the gate insulation layer and the insulating interlayer which are adjacent to the active layer are made of inorganic materials, a crack due to the folding is easily generated. That is, since the inorganic material is more brittle than the organic material, when the flexible thin film transistor substrate is frequently folded, cracks due to folding may be generated in the gate insulation layer and the insulating interlayer. Particularly, when the crack is generated in an interface between the active layer and the gate insulation layer, the bond between the active layer and the gate insulation layer is broken, and charge trap sites may be increased. Since the charge trap sites hinder a flow of charges flowing in the channel region of the active layer, a threshold voltage of the thin film transistor is shifted and a characteristic of the thin film transistor may deteriorate. Further, tensile stress generated due to folding causes a slip phenomenon of the active layer in the interface between the active layer and the gate insulation layer. Herein the slip phenomenon means a phenomenon that the active layer slips over the inorganic insulation layer due to breaking bonding there between. As a result, bonding is broken in the interface between the active layer and the gate insulation layer and deterioration of the thin film transistor may be caused.

However, in the flexible thin film transistor substrate 100a according to the exemplary embodiment of the present disclosure, the active layers 121 are separated from each other by the hole pattern H1a and the gate insulation layer 240 includes the side surface 241, the gate insulation layer 240 is cut between the thin film transistor areas T/A. Accordingly, the crack due to folding and the slip phenomenon may be decreased. That is, since the crack generated due to folding is blocked by the hole pattern H1a, the crack may not be propagated to the active layer 121. Since tension generated due to folding is decreased by the hole pattern H1a, cracks and the slip phenomenon may be reduced. Since the hole pattern H1a is extended in the different direction from the folding direction F, the tension generated due to folding may be decreased by the hole pattern H1a. Since the cracks and the slip phenomenon are reduced in the interface between the active layer 121 and the gate insulation layer 240, the deterioration of the thin film transistor TFT may not be generated in spite of repeated folding.

As described above, since the flexible thin film transistor substrate 100a includes one or more hole patterns H1a which separate the active layers 121 from each other, the propagation of cracks generated due to folding of the flexible thin film transistor substrate 100a is blocked and the tension generated while folding is distributed to suppress the slip phenomenon generated in the interface between the active layer 121 and the gate insulation layer 240. As a result, the deterioration of the thin film transistor TFT due to cracks and the slip phenomenon may be reduced, and even in spite of repeated folding, the thin film transistor TFT may maintain a unique characteristic. Accordingly, the lifespan of the flexible thin film transistor substrate 100a may be improved.

Figure 2B:
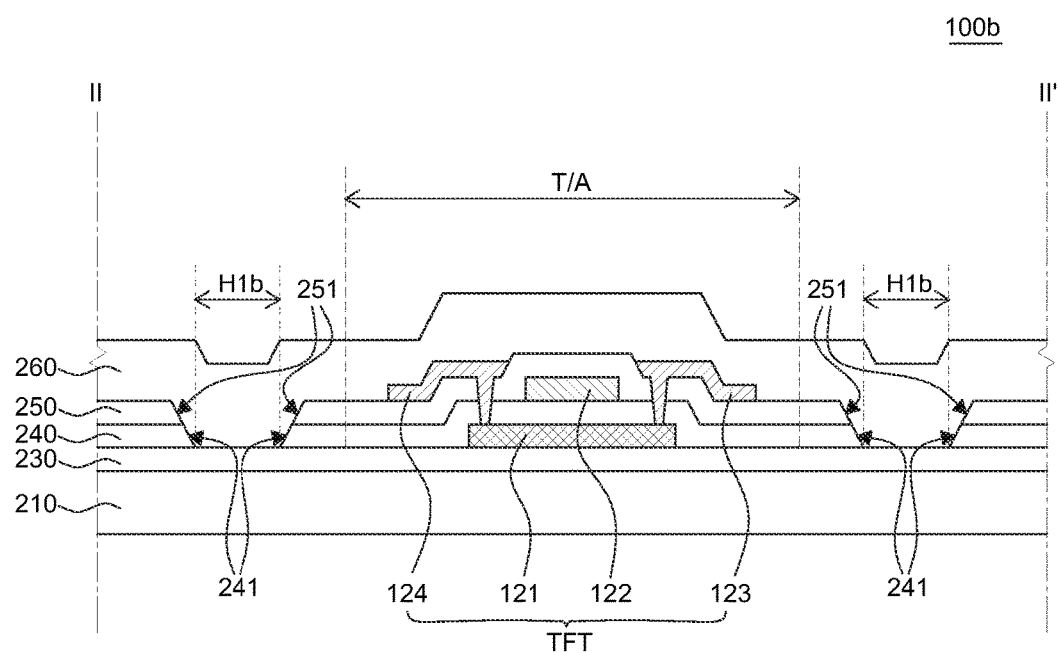
FIGS. 2B and 2C are schematic cross-sectional views of flexible thin film transistor substrates according to various exemplary embodiments of the present disclosure.
Figure 2C:
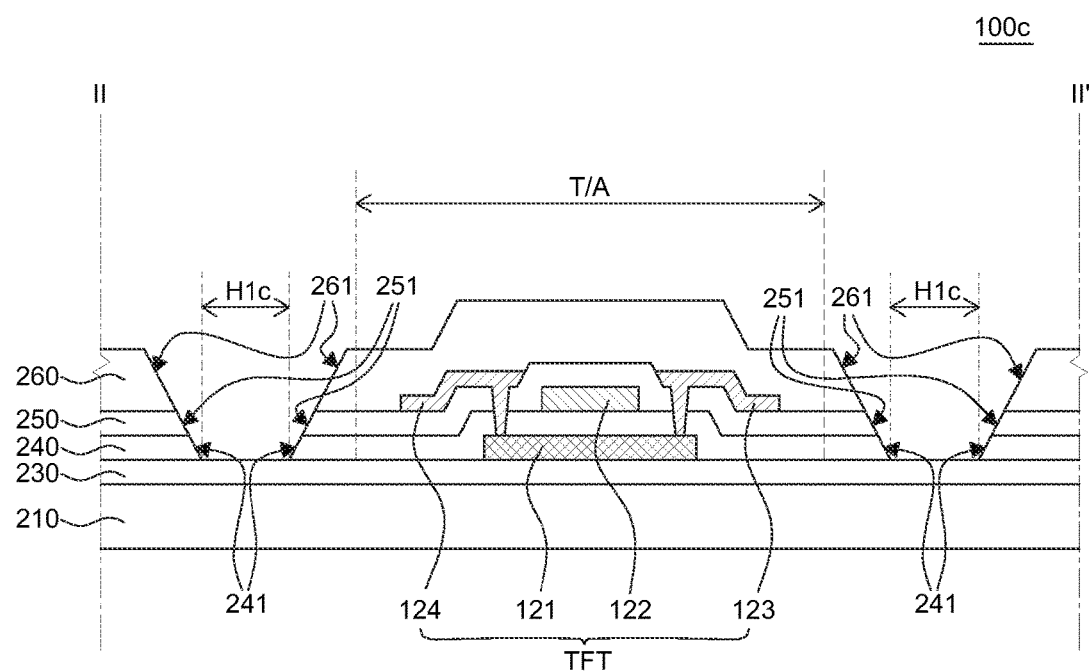

FIGS. 2B and 2C are schematic cross-sectional views of flexible thin film transistor substrates according to various exemplary embodiments of the present disclosure. Since flexible thin film transistor substrates 100b and 100c illustrated in FIGS. 2B and 2C are the same as the flexible thin film transistor substrate 100a illustrated in FIG. 2A, except that hole patterns H1b and H1c are further disposed in the insulating interlayer 250 and the passivation layer 260 than the flexible thin film transistor substrate 100a illustrated in FIG. 2A, the duplicated description will be omitted.

First, referring to FIG. 2B, the hole patterns H1b may be disposed in the gate insulation layer 240 and the insulating interlayer 250. That is, the hole pattern H1b of the insulating interlayer 250 corresponds to the hole pattern H1b of the gate insulation layer 240, and the insulating interlayer 250 includes a side surface 251 corresponding to the side surface 241 of the gate insulation layer 240. As described above, cracks due to folding and the slip phenomenon may be generated in all inorganic insulation layers. This is because the inorganic material is more brittle than the organic material. Accordingly, in the case where the hole patterns H1b are disposed in both the gate insulation layer 240 and the insulating interlayer 250, cracks due to folding and the slip phenomenon may be more efficiently suppressed. The hole patterns H1b may be formed by simultaneously patterning the gate insulation layer 240 and the insulating interlayer 250.

Referring to FIG. 2C, the hole patterns H1c may be disposed in the gate insulation layer 240, the insulating interlayer 250, and the passivation layer 260. That is, the insulating interlayer 250 includes a side surface 251 corresponding to the side surface 241 of the gate insulation layer 240, and the passivation layer 260 includes a side surface 261 corresponding to the side surface 251 of the insulating interlayer 250. As described above, since the passivation layer is an inorganic insulation layer made of the inorganic material, cracks may be generated due to folding even in the passivation layer. In addition, the cracks generated in the passivation layer may be propagated to the active layer through the insulating interlayer and the gate insulation layer. However, since the hole patterns H1c illustrated in FIG. 2C are disposed on the gate insulation layer 240, the insulating interlayer 250, and the passivation layer 260, cracks due to folding and the slip phenomenon may be more efficiently suppressed from being generated. The hole patterns H1c may be formed by simultaneously patterning the gate insulation layer 240, the insulating interlayer 250, and the passivation layer 260.

In some exemplary embodiments, in the case where the flexible thin film transistor substrate includes the buffer layer 230, the hole pattern may be further disposed in the buffer layer 230.

Figure 3:
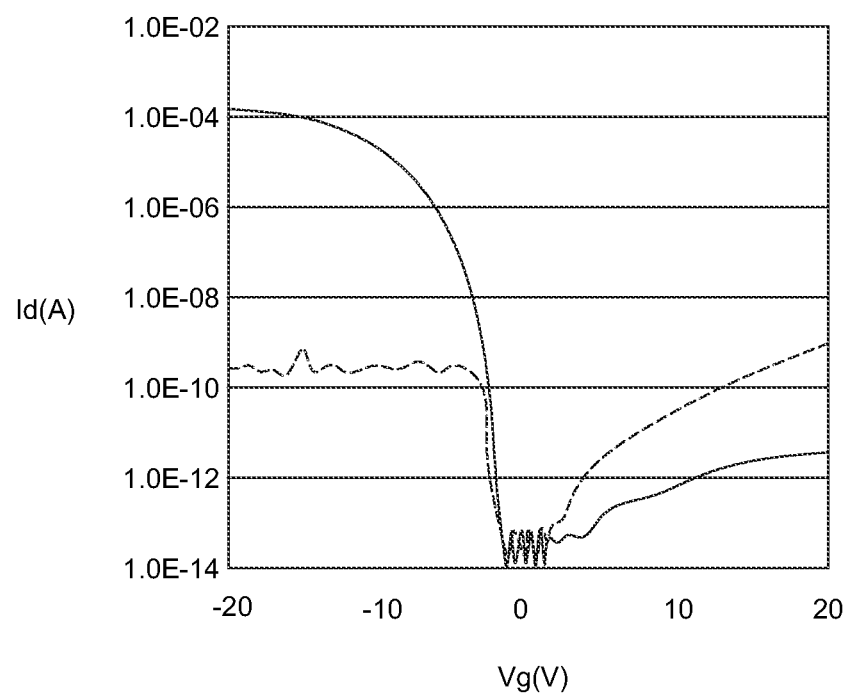
FIG. 3 is a graph for describing a current-voltage (I-V) characteristic of the flexible thin film transistor substrate according to the exemplary embodiment of the present disclosure.

FIG. 3 is a graph for describing a current-voltage (I-V) characteristic of the flexible thin film transistor substrate according to the exemplary embodiment of the present disclosure. In FIG. 3, a solid line represents an I-V characteristic when the flexible thin film transistor substrate including the hole patterns is folded 30,000 times, and a dotted line represents an I-V characteristic when the flexible thin film transistor substrate without the hole patterns is folded 30,000 times. In FIG. 3, the flexible thin film transistor substrate including the hole patterns equally includes the rest of the constituent elements except for the hole patterns as compared with the flexible thin film transistor substrate without the hole patterns. In the flexible thin film transistor substrate including the hole patterns, the hole patterns are disposed in the gate insulation layer and the insulating interlayer as illustrated in FIG. 2B. In addition, the thin film transistor included in the flexible thin film transistor substrate including the hole patterns is the same as the thin film transistor included in the thin film transistor substrate without the hole patterns, and both the thin film transistors are P type thin film transistors.

Referring to FIG. 3, when a gate voltage of −20 V is applied after the flexible thin film transistor substrate including the hole patterns is folded 30,000 times, a turn-on current of about $1 \times 10^{-4}$ A is provided. However, when a gate voltage of −20 V is applied after the flexible thin film transistor substrate without the hole patterns is folded 30,000 times, only the turn-on current of about $1 \times 10^{-10}$ A is provided. That is, since the hole patterns suppress the cracks generated by folding from being propagated and the tension generated while folding is blocked from being transferred to the active layer, the flexible thin film transistor substrate including the hole patterns may have an improved I-V characteristic. On the contrary, in the flexible thin film transistor substrate without the hole patterns, the cracks and the slip phenomenon are generated in the interface between the active layer and the gate insulation layer by the tension generating while folding and the charge trap sites generated by the cracks and the slip phenomenon hinder the turn-on current. Accordingly, the flexible thin film transistor substrate without the hole patterns provides a low turn-on current and deterioration of the I-V characteristic is generated.

Figure 4:
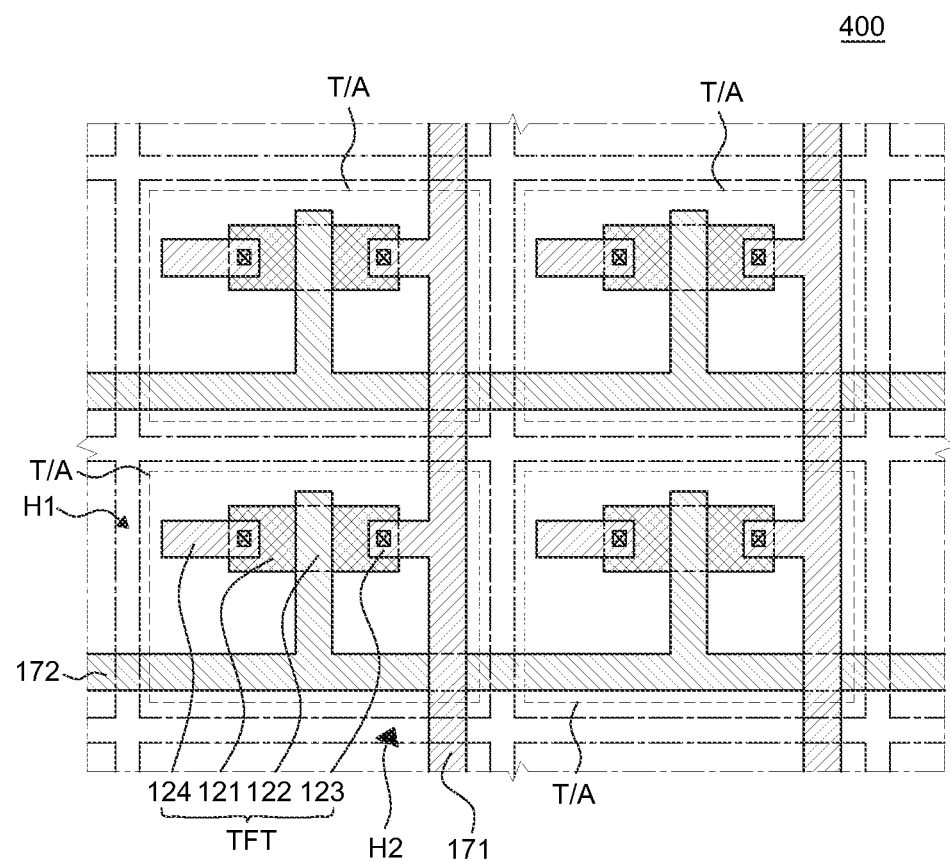
FIG. 4 is a schematic plan view of a flexible thin film transistor substrate according to another exemplary embodiment of the present disclosure.

FIG. 4 is a schematic plan view of a flexible thin film transistor substrate according to another exemplary embodiment of the present disclosure. Since a flexible thin film transistor substrate 400 illustrated in FIG. 4 is the same as the flexible thin film transistor substrate 100a illustrated in FIG. 1 except that a second hole pattern H2 is further included than the flexible thin film transistor substrate 100a illustrated in FIG. 1, the duplicated description thereof will be omitted.

Referring to FIG. 4, a first hole pattern H1 and a second hole pattern H2 surround the active layer 121 to isolate the active layer 121. The first hole pattern H1 and the second hole pattern H2 are extended in different directions. For example, as illustrated in FIG. 4, the first hole pattern H1 is extended in a parallel direction with the data line 171 and spaced apart form the data line 171 by a predetermined distance. Further, the second hole pattern H2 is extended in a parallel direction with the gate line 172 and spaced apart from the gate line 172 by a predetermined distance. The thin film transistor TFT is disposed in an area defined when the first hole pattern H1 and the second hole pattern H2 cross each other.

Since the active layer 121 is completely isolated by the first hole pattern H1 and the second hole pattern H2, even though the flexible thin film transistor substrate 400 is folded in various directions, the deterioration of the thin film transistor TFT may be reduced. That is, when the flexible thin film transistor substrate 400 is folded in the vertical direction, the horizontal direction, or the oblique direction, the first hole pattern H1 and the second hole pattern H2 may distribute the tension and the size of the tension applied to the active layer 121 may be reduced. Accordingly, the lifespan of the flexible thin film transistor substrate 400 may be further improved.

Figure 5:
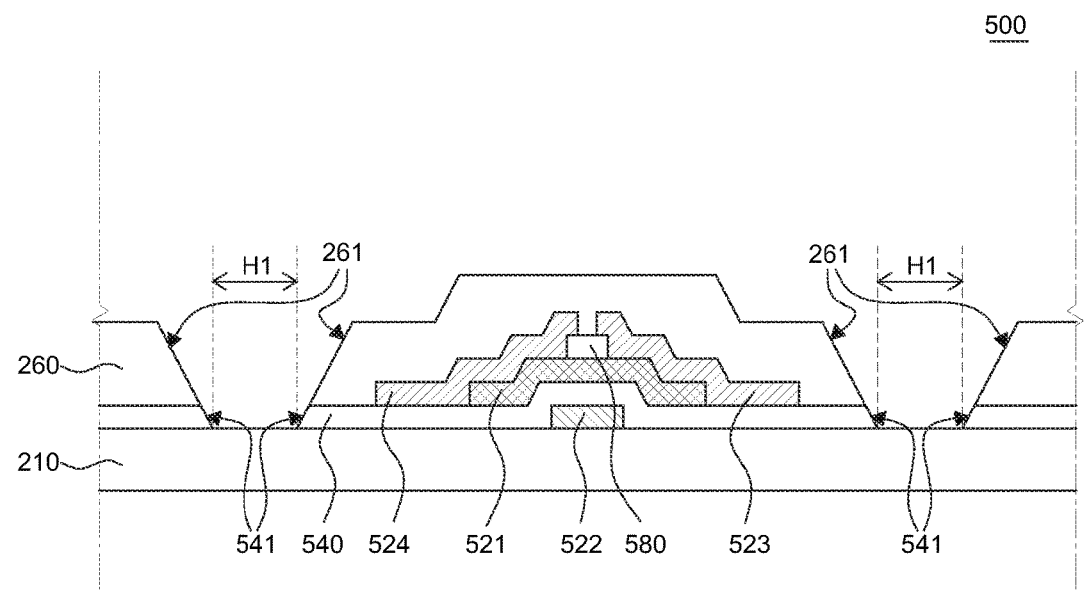
FIG. 5 is a schematic cross-sectional view of a flexible thin film transistor substrate according to yet another exemplary embodiment of the present disclosure.

FIG. 5 is a schematic cross-sectional view of a flexible thin film transistor substrate according to yet another exemplary embodiment of the present disclosure. Since a flexible thin film transistor substrate 500 illustrated in FIG. 5 is substantially the same as the flexible thin film transistor substrate 100c illustrated in FIG. 2C except that a structure of the thin film transistor is an inverted-staggered structure, as compared with the flexible thin film transistor substrate 100c illustrated in FIG. 2C, the duplicated description will be omitted.

Referring to FIG. 5, a gate electrode 522 is disposed on a flexible substrate 210. That is, the thin film transistor of the flexible thin film transistor substrate 500 may be a thin film transistor having a bottom gate structure. Since the gate electrode 522 is the same as the gate electrode 122 illustrated in FIG. 2C, the duplicated description will be omitted.

A gate insulation layer 540 is disposed on the gate electrode 522. The gate insulation layer 540 may cover the entire surface of the flexible substrate 210 including the gate electrode 522. In some exemplary embodiments, since the gate insulation layer 540 insulates an active layer 521 from the gate electrode 522, the gate insulation layer 540 may be disposed only on the gate electrode 522. Since the gate insulation layer 540 is the same as the gate insulation layer 240 illustrated in FIG. 2C, the duplicated description will be omitted.

The active layer 521 is disposed on the gate insulation layer 540 and at least a part of the active layer 521 overlaps with the gate electrode 522. For example, the channel region of the active layer 521 overlaps with the gate electrode 522. Since the active layer 521 is the same as the active layer 121 illustrated in FIG. 2C, the duplicated description will be omitted.

A source electrode 523 and a drain electrode 524 are disposed on the active layer 521 and electrically connected with apart of the active layer 521, respectively. For example, the source electrode 523 and the drain electrode 524 may be electrically connected with a source region and a drain region of the active layer 521, respectively. Since the source electrode 523 and the drain electrode 524 are the same as the source electrode 123 and the drain electrode 124 illustrated in FIG. 2C, respectively, the duplicated description will be omitted.

An etch stop layer 580 is disposed on the active layer 521. The etch stop layer 580 is disposed on the active layer 521 between the source electrode 523 and the drain electrode 524. The etch stop layer 580 suppresses etching of the active layer 521 in a process of patterning the source electrode 523 and the drain electrode 524. The etch stop layer 580 may be made of a material having low etch selectivity with respect to an etchant for etching the source electrode 523 and the drain electrode 524.

A passivation layer 260 is disposed to cover the gate insulation layer 540, the source electrode 523, the etch stop layer 580, and the drain electrode 524. Since the passivation layer 260 is the same as the passivation layer 260 illustrated in FIG. 2C, the duplicated description will be omitted. In some exemplary embodiments, the passivation layer 260 may be omitted.

Hole patterns H1 are disposed in the gate insulation layer 540 and the passivation layer 260. Accordingly, the gate insulation layer 540 includes a side surface 541 corresponding to a boundary of the hole pattern H1 and the passivation layer 260 includes a side surface 261 corresponding to the side surface 541 of the gate insulation layer 540. The hole patterns H1 separate the active layers 521 from each other. The hole patterns H1 suppress cracks generated due to folding from being propagated, and the hole patterns H1 disperse tension generated due to folding. Thus, a slip phenomenon of the active layer 521 in an interface between the active layer 521 and the gate insulation layer 540 can be suppressed. Although not illustrated in FIG. 5, in some exemplary embodiments, the hole pattern H1 may be disposed only in the gate insulation layer 540.

As described above, the hole pattern H1 isolates the active layer 521 to suppress the tension generated due to folding from being transferred to the active layer 521 and suppress cracks generated due to folding from being propagated to the active layer 521. As a result, the active layer 521 may be stably protected in spite of repeated folding, and cracks and deterioration of the thin film transistor due to folding may be suppressed.

Figure 6:
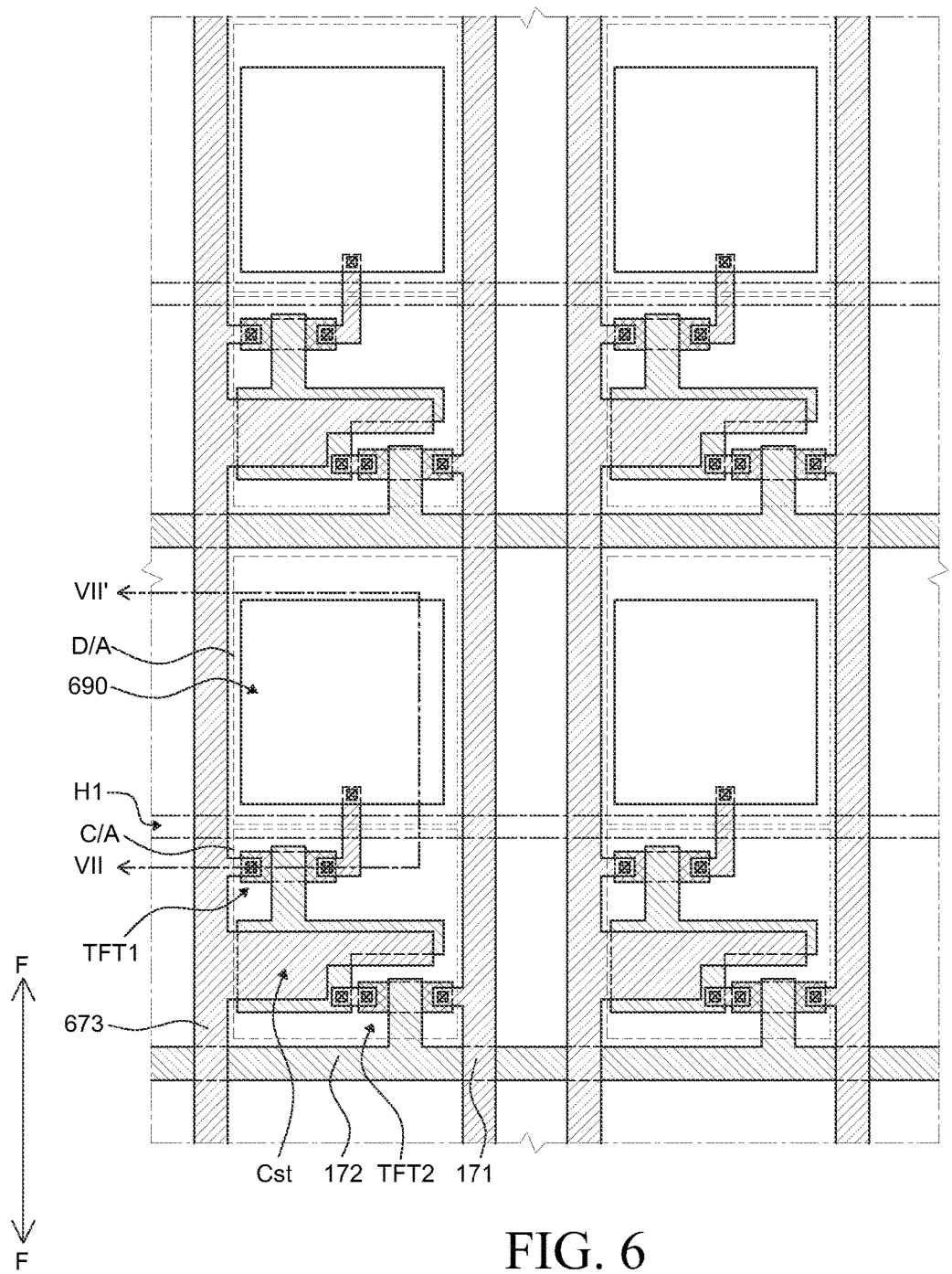
FIG. 6 is a schematic plan view of a flexible organic light emitting display device according to an exemplary embodiment of the present disclosure.
Figure 7:
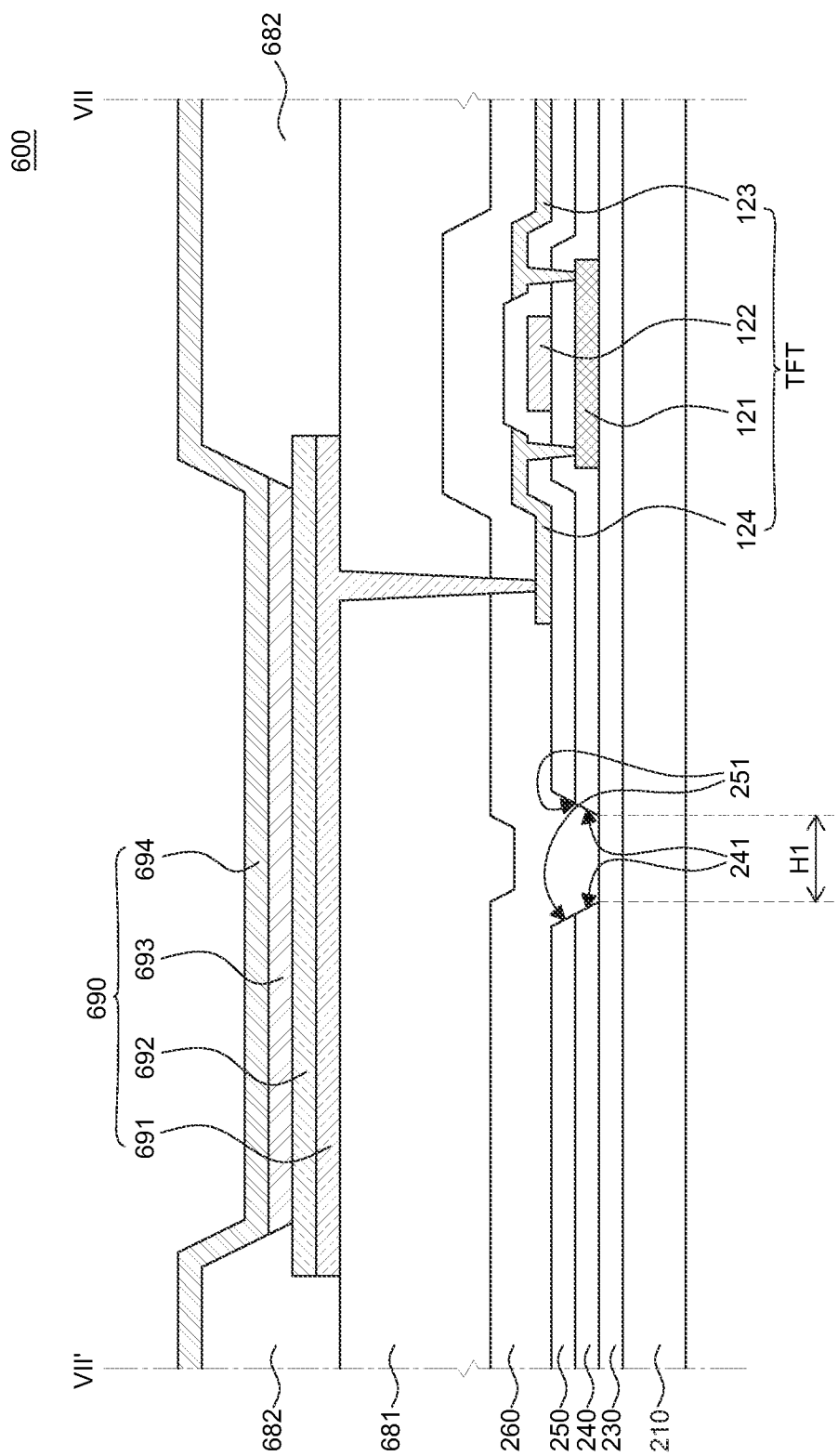
FIG. 7 is a schematic cross-sectional view of the flexible organic light emitting display device taken along line VII-VII' of FIG. 6.

FIG. 6 is a schematic plan view of a flexible organic light emitting display device according to an exemplary embodiment of the present disclosure. FIG. 7 is a schematic cross-sectional view of the flexible organic light emitting display device taken along line VII-VII' of FIG. 6. Since a flexible substrate 210 of a flexible organic light emitting display device 600 illustrated in FIGS. 6 and 7 is the same as the flexible substrate 210 illustrated in FIG. 2B and a first thin film transistor TFT1 and a second thin film transistor TFT2 of the flexible organic light emitting display device 600 illustrated in FIGS. 6 and 7 are the same as the thin film transistor TFT illustrated in FIG. 2B, the duplicated description thereof will be omitted.

Referring to FIGS. 6 and 7, the flexible organic light emitting display device 600 includes a flexible substrate 210, a first thin film transistor TFT1, a second thin film transistor TFT2, a storage capacitor Cst, and an organic light emitting element 690.

The flexible substrate 210 includes a circuit area C/A and a display area D/A. The circuit area C/A is an area where the first thin film transistor TFT1, the second thin film transistor TFT2, and the storage capacitor Cst are disposed, and the display area D/A is an area where the organic light emitting element 690 is disposed and may be also referred to as a sub pixel area. In FIG. 6, for convenience of description, the circuit area C/A and the display area D/A having quadrangular shapes are illustrated, respectively. However, the shapes of the circuit area C/A and the display area D/A are not necessarily the quadrangular shapes, and the flexible substrate 210 may include a circuit area C/A and a display area D/A having polygons, circles, or ovals except for the quadrangles. One boundary of the circuit area C/A may contact one boundary of the display area D/A. Since the first thin film transistor TFT1 is connected with the organic light emitting element 690, at a portion where the first thin film transistor TFT1 and the organic light emitting element 690 are connected with each other, one boundary of the circuit area C/A may contact one boundary of the display area D/A.

The first thin film transistor TFT1 is disposed in the circuit area C/A on the flexible substrate 210. The first thin film transistor TFT1 includes a gate electrode 122 connected with the storage capacitor Cst, a source electrode 123 connected with a driving voltage line 673, and a drain electrode 124 connected with the organic light emitting element 690 to serve as a driving thin film transistor.

The second thin film transistor TFT2 is disposed in the circuit area C/A on the flexible substrate 210. The second thin film transistor TFT2 includes a gate electrode connected with the gate line 172, a drain electrode connected with the storage capacitor Cst, and a source electrode connected with the data line 171 to serve as a switching transistor.

The storage capacitor Cst is disposed in the circuit area C/A on the flexible substrate 210. The storage capacitor Cst includes a first electrode connected with the drain electrode of the second thin film transistor TFT2 and the gate electrode 122 of the first thin film transistor TFT1, and a second electrode connected with the driving voltage line 673 and the source electrode 123 of the first thin film transistor TFT1. The storage capacitor Cst stores a voltage corresponding to a difference between a data voltage transferred through the drain electrode of the second thin film transistor TFT2 and a driving voltage transferred through the driving voltage line 673 and uniformly maintains the gate voltage of the first thin film transistor TFT1 for one frame.

The organic light emitting element 690 is disposed in the display area D/A on the flexible substrate 210 and configures pixels of the flexible organic light emitting display device 600. The flexible organic light emitting display device 600 may include a plurality of organic light emitting elements 690. As illustrated in FIG. 7, a planarization layer 681 for planarizing an upper surface of the flexible substrate 210 is disposed on the first thin film transistor TFT1 and the organic light emitting element 690 is disposed on the planarization layer 681 of the display area D/A. The organic light emitting element 690 includes a first electrode 692, an organic light emission layer 693, and a second electrode 694 which are electrically connected with the first thin film transistor TFT1.

The first electrode 692 may be separated and disposed in each display area D/A. That is, the first electrode 692 is separately disposed for each of a plurality of sub pixel areas. The first electrode 692 may be electrically connected with the first thin film transistor TFT1. For example, the first electrode 692 may be electrically connected with the drain electrode 124 of the first thin film transistor TFT1. The first electrode 692 may be an anode providing holes to the organic light emission layer 693. In this case, the first electrode 692 is configured by a conductive material having a high work function. For example, the first electrode 692 may be made of transparent conductive oxide (TCO) having a high work function, such as indium tin oxide (ITO), indium zinc oxide (IZO), indium tin zinc oxide (ITZO), zinc oxide, and tin oxide.

As illustrated in FIG. 7, in the case where the flexible organic light emitting display device 600 is a top emission type organic light emitting display device, a reflective layer 691 is disposed below the first electrode 692. The reflective layer 691 reflects light emitted to the first electrode 692 side from the organic light emission layer 693 to the upper portion of the flexible organic light emitting display device 600. The reflective layer 691 may be made of silver, nickel, gold, platinum, aluminum, copper, or molybdenum/aluminum neodymium (Mo/AlNd) having excellent reflectance. Although not illustrated in FIG. 7, in the case where a flexible organic light emitting display device 700 is a bottom emission type organic light emitting display device, the reflective layer 691 may be omitted.

A bank layer 682 is disposed on the first electrode 692 and the planarization layer 681. The bank layers 682 separate adjacent display areas D/A from each other and may be disposed between the adjacent display areas D/A.

The organic light emission layer 693 is disposed on the first electrode 692 exposed by the bank layer 682. The organic light emission layer 693 generates red, green, or blue light based on a hole received from the first electrode 692 and an electron received from the second electrode 694. Although not illustrated in FIG. 7, the organic light emission layer 693 may generate white light, and in this case, the organic light emission layers 693 of all of the display areas D/A may cover the first electrode 692 and the bank layer 682 so as to be connected with each other.

The second electrode 694 is disposed on the organic light emission layer 693 and the bank layer 682. The second electrode 694 may be a cathode providing an electron to the organic light emission layer 693. In this case, the second electrode 694 is made of a material having high electric conductivity and a low work function. A particular material configuring the second electrode 694 may vary according to an emission type of the organic light emitting display device. As illustrated in FIG. 7, in the case where the flexible organic light emitting display device 600 is the top emission type organic light emitting display device, the second electrode 694 may be made of a metallic material having a low work function, such as silver, titanium, aluminum, molybdenum, and an alloy of silver and magnesium. In this case, the second electrode 694 may have a small thickness so as to transmit light. Furthermore, the second electrode 694 may be a transparent electrode made of a TCO material. In this case, a metal doping layer for facilitating injection of electrons may be disposed between the second electrode 694 and the organic light emission layer 693.

As illustrated in FIG. 6, the hole pattern H1 is disposed on a boundary where the circuit area C/A and the display area D/A contact each other. That is, the circuit areas C/A may be separated from each other by the hole patterns H1.

As described in FIG. 7, the hole patterns H1 are disposed in the gate insulation layer 240 and the insulating interlayer 250. In some exemplary embodiments, the hole patterns H1 may be further disposed in the passivation layer 260 and further disposed on the buffer layer 230. Since the buffer layer 230, the gate insulation layer 240, the insulating interlayer 250, and the passivation layer 260 all are disposed below the organic light emitting element 690, the hole patterns H1 do not deteriorate visibility of the flexible organic light emitting display device 600. Since the hole patterns H1 are the same as the hole patterns H1b of the flexible organic light emitting display device 100*b* illustrated in FIG. 2B, the duplicated description will be omitted.

As described above, the hole patterns H1 suppress the cracks generated due to folding from be propagated to the interface between the active layer 121 and the gate insulation layer 240 and the tension generated while folding is distributed to suppress a slip from being generated in the interface between the active layer 121 and the gate insulation layer 240. Accordingly, the deterioration of the first thin film transistor TFT1 and the second thin film transistor TFT2 due to folding may be reduced, and the lifespan of the flexible organic light emitting display device 600 may be increased. Particularly, since the inorganic material is relatively more brittle than the organic material, it is effective that the hole pattern H1 is disposed in at least one of the buffer layer 230, the gate insulation layer 240, the insulating interlayer 250, and the passivation layer 260, which are made of inorganic materials.

Figure 8:
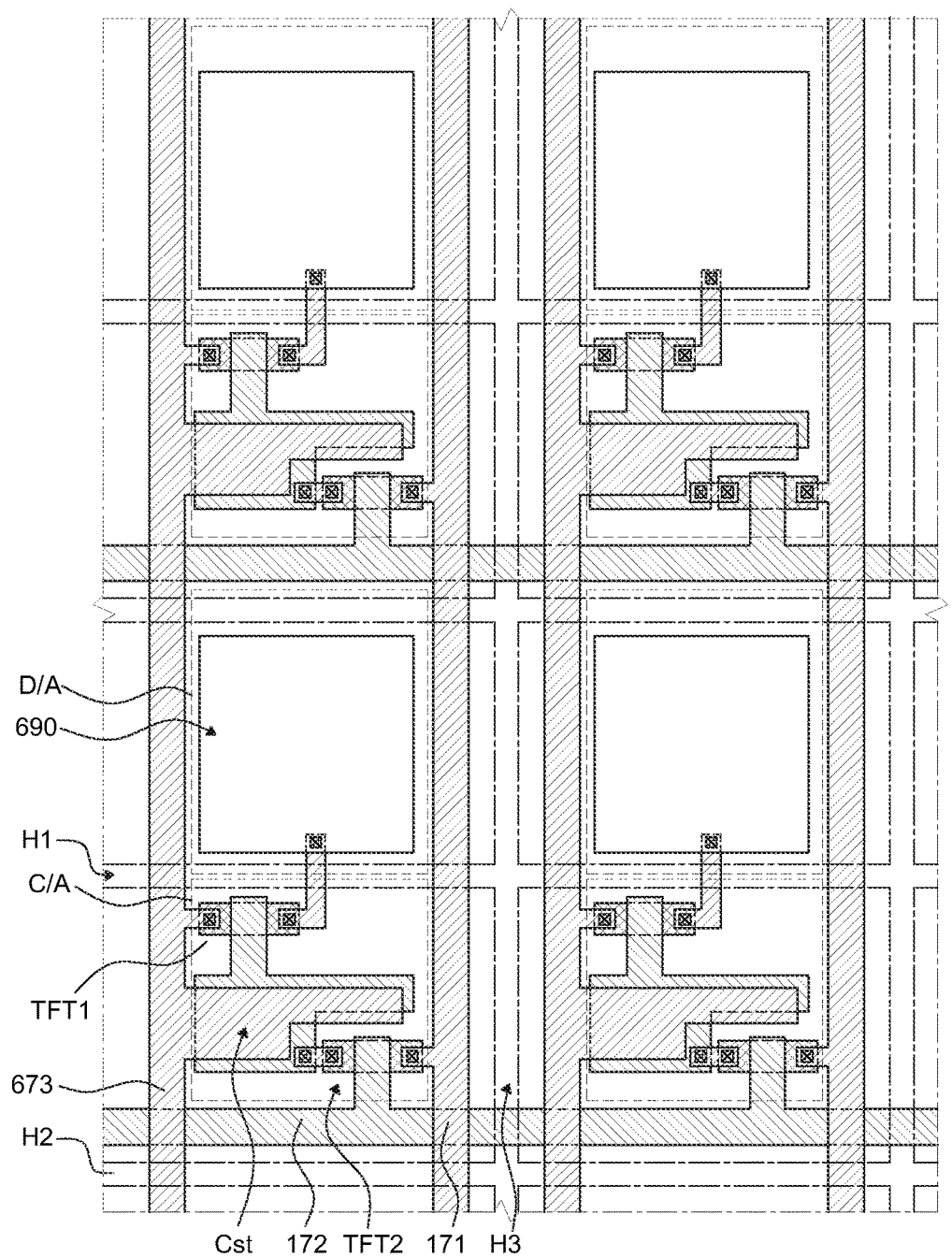
FIG. 8 is a schematic plan view of a flexible organic light emitting display device according to another exemplary embodiment of the present disclosure.

FIG. 8 is a schematic plan view of a flexible organic light emitting display device according to another exemplary embodiment of the present disclosure. A flexible organic light emitting display device 800 illustrated in FIG. 8 is the same as the flexible organic light emitting display device 600 illustrated in FIG. 6 except that a second hole pattern H2 and a third hole pattern H3 are further included than the flexible organic light emitting display device 600 illustrated in FIG. 6. Accordingly, the duplicated description will be omitted.

Referring to FIG. 8, the second hole pattern H2 is disposed in a parallel direction with the gate line 172. Circuit areas C/A are separated from each other by the first hole pattern H1 and the second hole pattern H2. In FIG. 8, for convenience of description, the first hole pattern H1 and the second hole pattern H2 are illustrated in a straight form to be parallel with each other, but the first hole pattern H1 and the second hole pattern H2 may be extended in different directions and may be extended in a curved or zigzag form. The second hole pattern H2 is spaced apart from the gate line 172. For example, the second hole pattern H2 may be spaced apart from the gate line 172 by about 2 μm or more. Since the second hole pattern H2 is the same as the hole pattern H1 illustrated in FIG. 6, the duplicated description will be omitted.

The third hole pattern H3 is disposed in a parallel direction with the data line 171. The data line 171 is extended in a different direction from the gate line 172 and connected with a source electrode or a drain electrode of the second thin film transistor TFT2. For convenience of description, in FIG. 8, the data line 171 which is extended vertically to the gate line 172 is illustrated. Even though the third hole pattern H3 is illustrated in a straight form in FIG. 8, the third hole pattern H3 may be extended in a curved or zigzag form. The third hole pattern H3 is spaced apart from the data line 171. For example, the third hole pattern H3 may be spaced apart from the data line 171 by about 2 μm or more. The first thin film transistor TFT1 and the second thin film transistor TFT2 are surrounded by the first hole pattern H1, the second hole pattern H2, and the third hole pattern H3 to be isolated.

Although the first thin film transistor TFT1 and the second thin film transistor TFT2 isolated by three hole patterns are illustrated in FIG. 8, the first thin film transistor TFT1 and the second thin film transistor TFT2 may be isolated by one hole pattern.

In some exemplary embodiments, the first thin film transistor TFT1 and the second thin film transistor TFT2 may be isolated by individual hole patterns, respectively. In this case, the deterioration of the first thin film transistor TFT1 and the second thin film transistor TFT2 may be more efficiently suppressed.

The flexible organic light emitting display device 800 according to another exemplary embodiment of the present disclosure includes the first hole pattern H1, the second hole pattern H2, and the third hole pattern H3 which isolate the circuit area C/A to efficiently suppress the deterioration of the first thin film transistor TFT1 and the second thin film transistor TFT2 due to folding. Particularly, since the first hole pattern H1, the second hole pattern H2, and the third hole pattern H3 are extended in various directions, the tension generated while folding may be dispersed in various directions. As a result, even though the flexible organic light emitting display device 800 is folded in various directions, the tension applied to the first thin film transistor TFT1 and the second thin film transistor TFT2 may be efficiently reduced. Therefore, the lifespan of the flexible organic light emitting display device 800 may be improved.

Figure 9A:
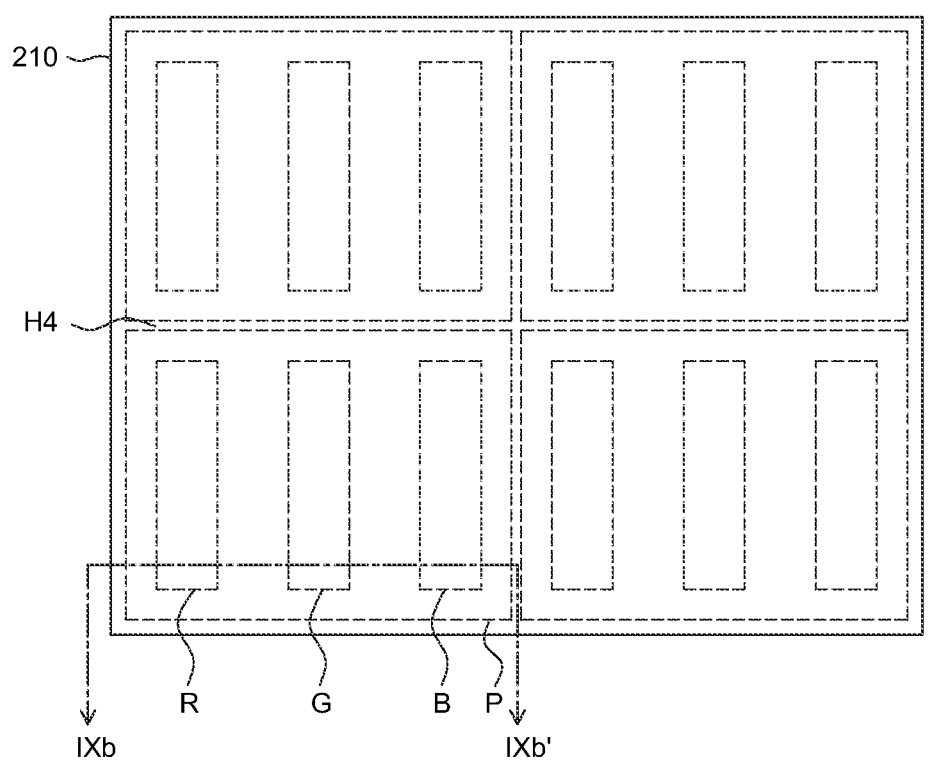
FIG. 9A is a schematic plan view of a top-emission type flexible organic light emitting display device according to yet another exemplary embodiment of the present disclosure.

FIG. 9A is a schematic plan view of a top-emission type flexible organic light emitting display device according to yet another exemplary embodiment of the present disclosure.

Referring to FIG. 9A, a flexible organic light emitting display device 900 according to yet another exemplary embodiment of the present disclosure includes a plurality of pixel areas P. Each of the plurality of pixel areas P is an area for displaying one color and includes a plurality of sub pixel areas R, G, and B. As illustrated in FIG. 9A, one pixel area P may include a first sub pixel area R, a second sub pixel area G, and a third sub pixel area B. In each of the first sub pixel area R, the second sub pixel area G, and the third sub pixel area B, light having a different color is emitted, and in detail, light of any one of red, green, and blue is emitted.

Figure 9B:
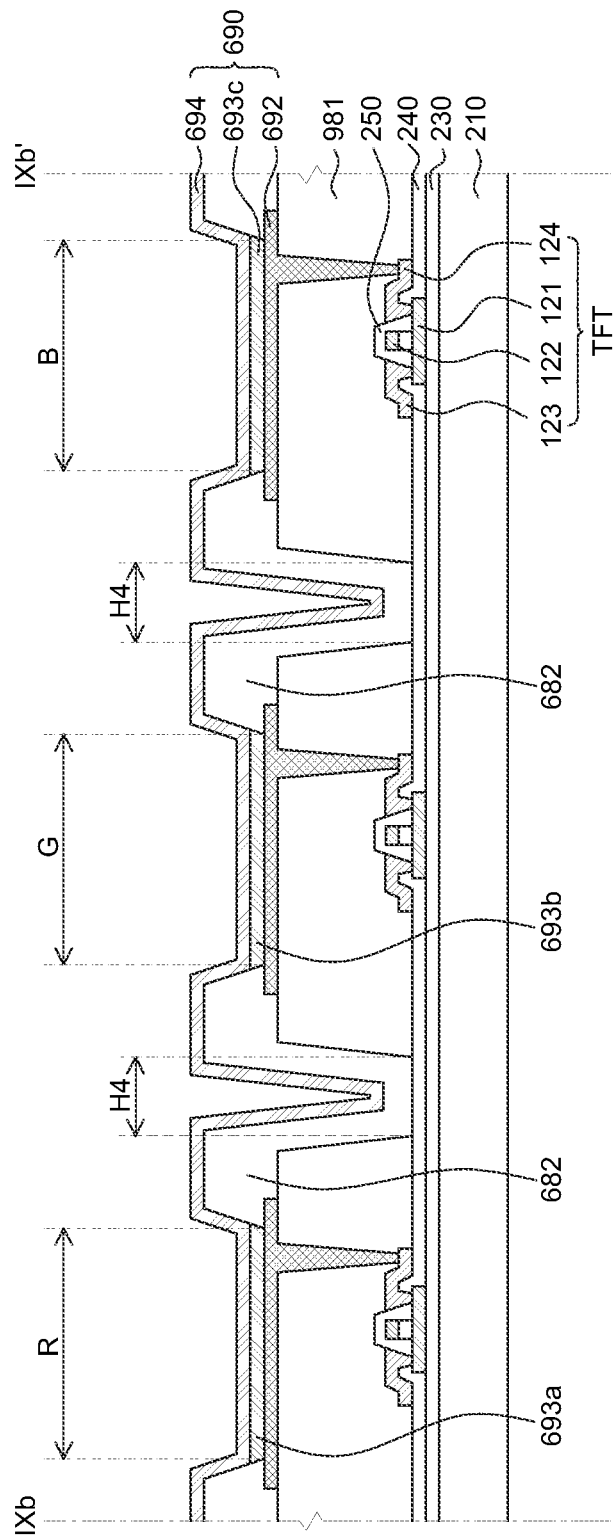
FIG. 9B is a schematic cross-sectional view of the flexible organic light emitting display device taken along line IXb-IXb' of FIG. 9A.
Figure 9C:
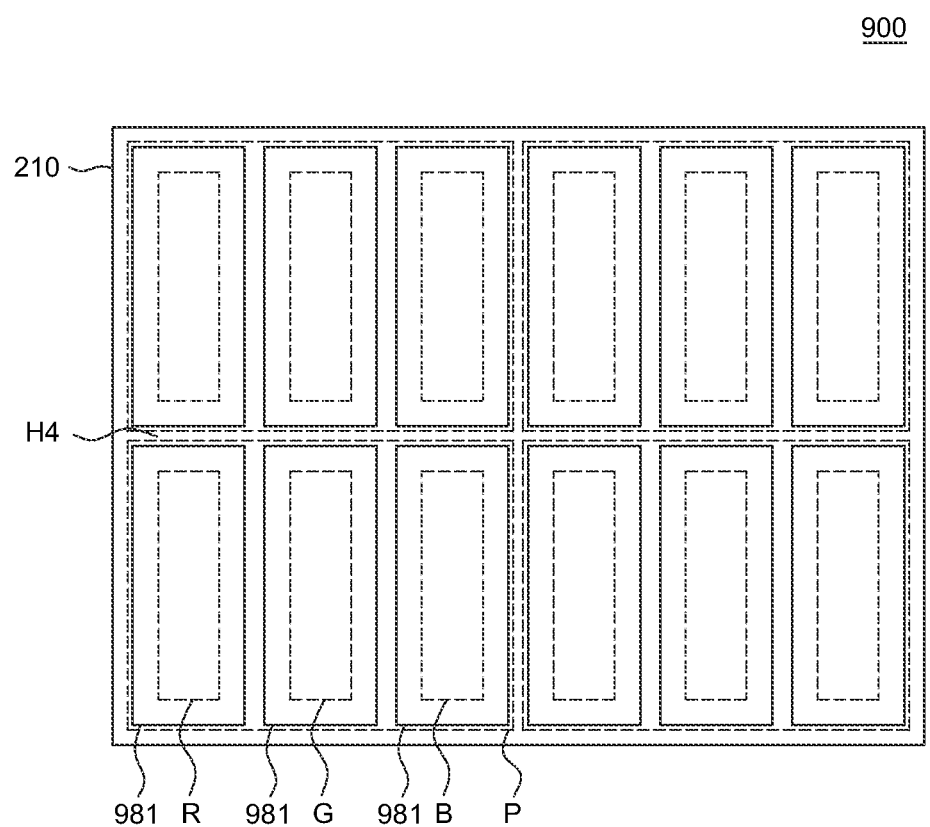
FIG. 9C is a schematic plan view illustrating only a pixel area, a flexible substrate, and a planarization layer in the flexible organic light emitting display device of FIG. 9A.

FIG. 9B is a schematic cross-sectional view of the flexible organic light emitting display device taken along line IXb-IXb' of FIG. 9A. FIG. 9C is a schematic plan view illustrating only a pixel area, a flexible substrate, and a planarization layer in the flexible organic light emitting display device of FIG. 9A.

Referring to FIGS. 9B and 9C, a planarization layer 981 is disposed to cover a thin film transistor TFT of the flexible organic light emitting display device 900. The planarization layer 981 is an organic insulation layer planarizing the top of the flexible substrate 210 and also referred to as an overcoating layer. In order to planarize the top of the flexible substrate 210, the planarization layer 981 may be made of an organic material, for example, photosensitive photo acryl or photosensitive polyimide. In the planarization layer 981, a contact hole for electrically connecting the drain electrode 124 of the thin film transistor TFT and the first electrode 692 is formed.

On the planarization layer 981, a hole pattern H4 is formed. As illustrated in FIG. 9C, the hole pattern H4 extends to form a mesh pattern. The planarization layer 981 is separately disposed on the flexible substrate 210 by the hole pattern H4. In detail, as illustrated in FIGS. 9B and 9C, the planarization layer 981 is divided for each sub pixel area R, G, or B on the flexible substrate 210 by the hole pattern H4, and that is, disposed independently in each of the plurality of sub pixel areas R, G, and B.

As illustrated in FIG. 9B, a bank layer 682 is disposed on the flexible substrate 210 to cover an edge of the first electrode 692. In FIG. 9B, a reflective layer is omitted. The bank layer 682 is disposed to fill the hole pattern H4 formed on the planarization layer 981. The bank layer 682 serves to divide the plurality of sub pixel areas R, G, and B. The bank layer 682 is an organic insulation layer made of a transparent organic material. For example, the bank layer 682 may be made of any one of polyimide, photo acryl, and benzocyclobuten (BCB) or made of a material displaying black, for example, a black resin.

In FIGS. 9B and 9C, it is illustrated that the planarization layer 981 is divided on the flexible substrate 210 for each sub pixel area R, G, or B, but the planarization layer 981 may be divided on the flexible substrate 210 for each pixel area P. Furthermore, the planarization layer 981 may be divided on the flexible substrate 210 for each of the plurality of pixel areas P.

Figure 10A:
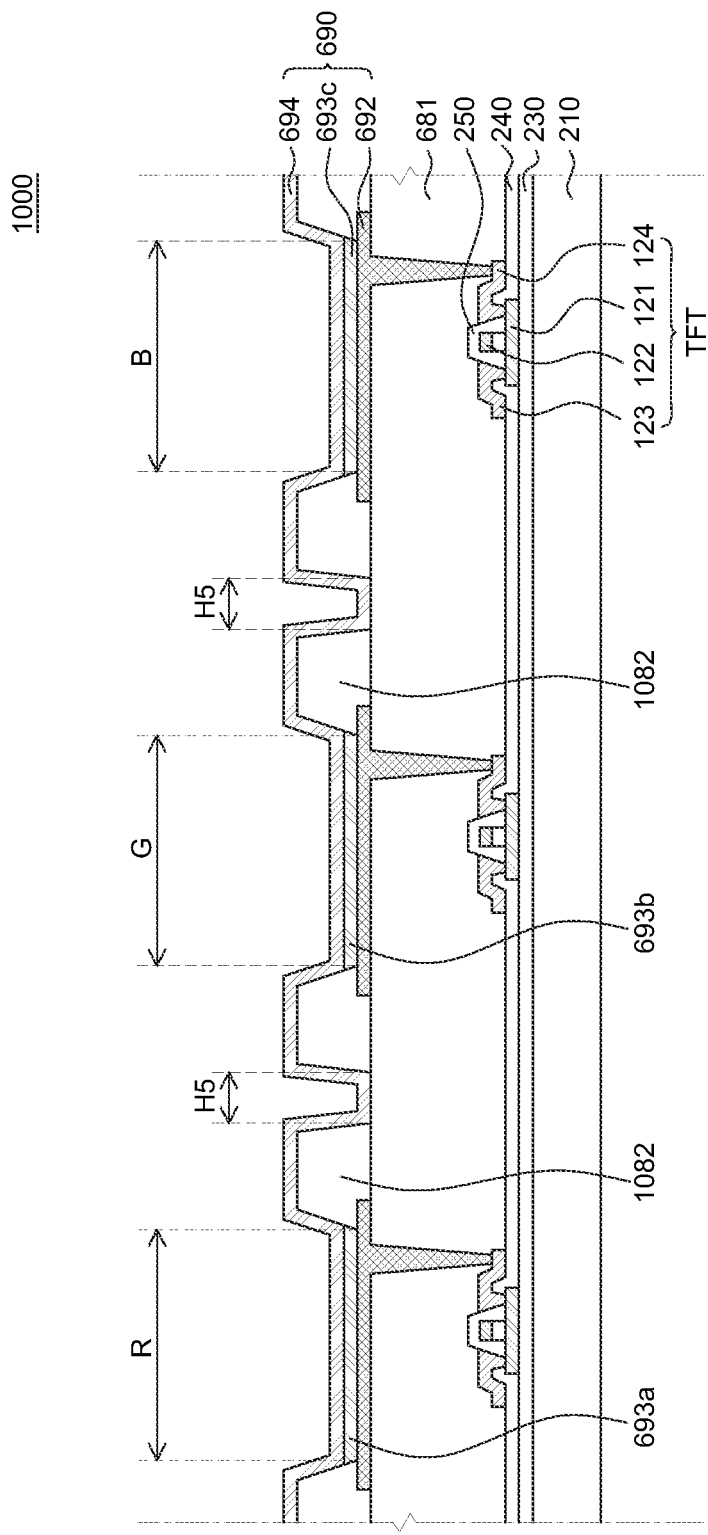
FIG. 10A is a schematic cross-sectional view of a flexible organic light emitting display device according to still another exemplary embodiment of the present disclosure.
Figure 10B:
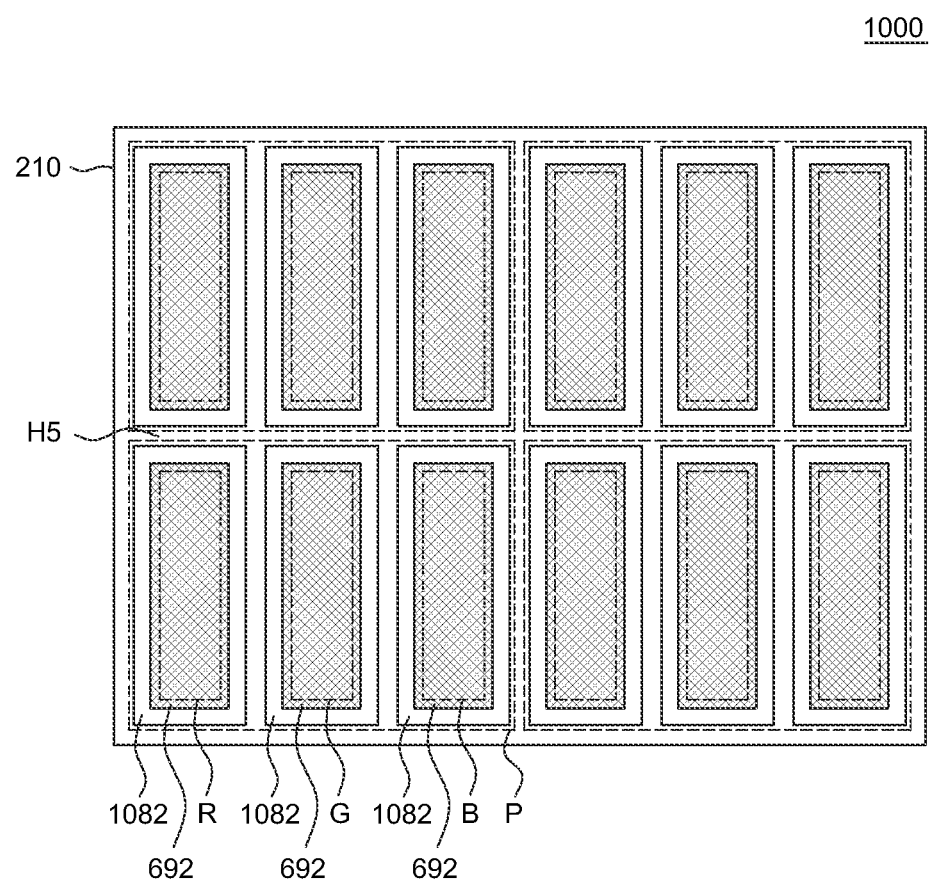
FIG. 10B is a schematic plan view illustrating only a pixel area, a flexible substrate, a first electrode, and a bank layer in the flexible organic light emitting display device of FIG. 10A.

FIG. 10A is a schematic cross-sectional view of a flexible organic light emitting display device according to still another exemplary embodiment of the present disclosure. FIG. 10B is a schematic plan view illustrating only a pixel area, a flexible substrate, a first electrode, and a bank layer in the flexible organic light emitting display device of FIG. 10A. A flexible organic light emitting display device 1000 of FIG. 10A is different from the flexible organic light emitting display device 900 in that a hole pattern H5 is formed only in a bank layer 1082. However, as other constituent elements are the same as the flexible organic light emitting display device 900, the duplicated description will be omitted.

Referring to FIGS. 10A and 10B, in the flexible organic light emitting display device 1000 according to still another exemplary embodiment of the present disclosure, the hole pattern is not formed in the planarization layer 681, but the hole pattern H5 is formed in the bank layer 1082. Accordingly, the bank layer 1082 is separately disposed on the flexible substrate 210 by the hole pattern H5. In detail, as illustrated in FIGS. 10A and 10B, the bank layer 1082 is divided for each sub pixel area R, G, or B on the flexible substrate 210 by the hole pattern H5, that is, the bank layer 1082 is disposed independently in each of the plurality of sub pixel areas R, G, and B.

As illustrated in FIG. 10A, the hole pattern H5 formed in the bank layer 1082 may be filled with the second electrode 694.

Figure 11:
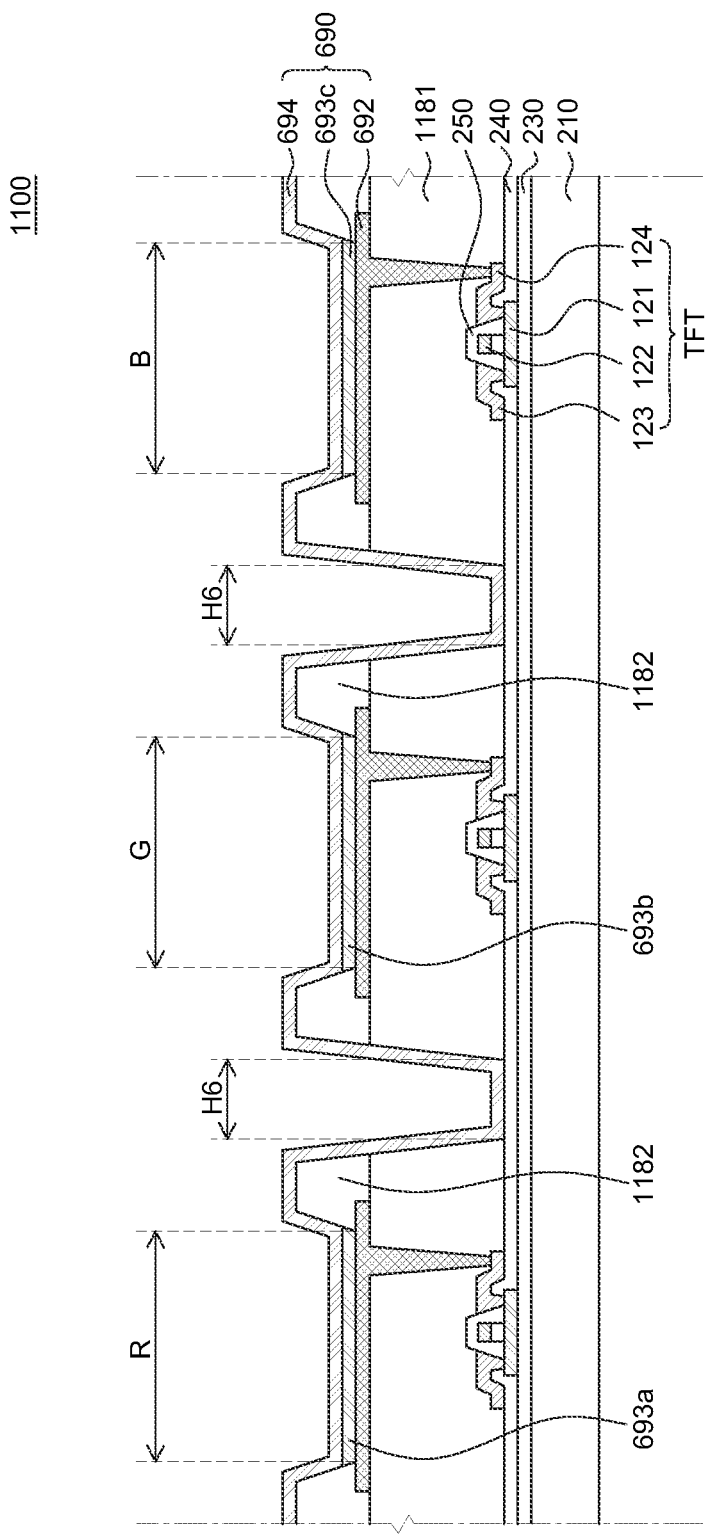
FIG. 11 is a schematic cross-sectional view of a flexible organic light emitting display device according to still another exemplary embodiment of the present disclosure.

FIG. 11 is a schematic cross-sectional view of a flexible organic light emitting display device according to still another exemplary embodiment of the present disclosure. A flexible organic light emitting display device 1100 of FIG. 11 is different from the flexible organic light emitting display device 900 of FIG. 9A in that hole patterns H6 are formed in both a planarization layer 1181 and a bank layer 1182. However, as other constituent elements thereof are the same as those of the flexible organic light emitting display device 900, the duplicated description will be omitted.

Referring to FIG. 11, in the flexible organic light emitting display device 1100 according to still another exemplary embodiment of the present disclosure, the hole patterns H6 are formed in the bank layer 1182 as well as the planarization layer 1181, that is, the hole patterns H6 are formed both in the planarization layer 1181 and the bank layer 1182. Accordingly, both the planarization layer 1181 and the bank layer 1182 are separately disposed on the flexible substrate 210 by the hole patterns H6. In detail, as illustrated in FIG. 11, the planarization layer 1181 and the bank layer 1182 are divided on the flexible substrate 210 for each sub pixel area R, G, or B by the hole patterns H6. That is, the planarization layer 1181 and the bank layer 1182 are disposed independently in each of the plurality of sub pixel areas R, G, and B.

As illustrated in FIG. 11, the hole patterns H6 formed in the planarization layer 1181 and the bank layer 1182 may be filled with the second electrode 694.

In the flexible organic light emitting display device of the present disclosure, at least one of the planarization layer and the bank layer made of an organic material is separately disposed on the flexible substrate by the hole pattern. Accordingly, the planarization layer and the bank layer are not disposed on the entire surface of the flexible substrate to be separated from each other. However, as compared with the flexible organic light emitting display device in the related art in which the planarization layer and the bank layer are disposed by one continuous layer, the following advantageous effects may be achieved.

Figure 12:
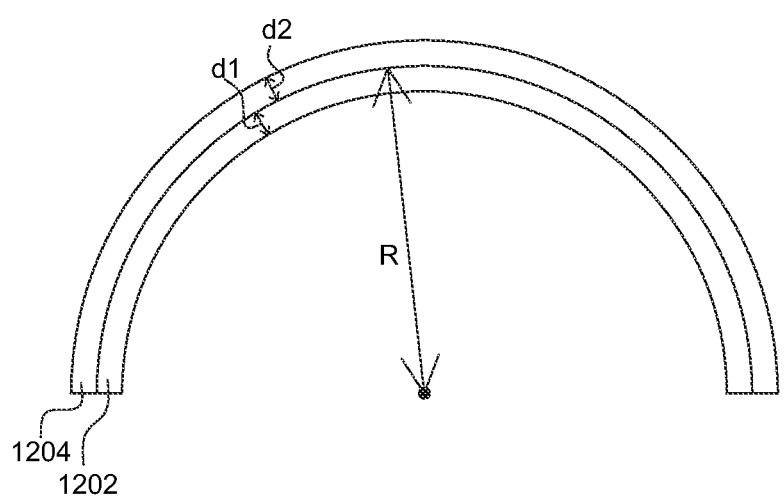
FIG. 12 is a diagram describing stress applied to a second layer when a first layer and a second layer which are adjacent to each other and continuous are bent.
Figure 13:
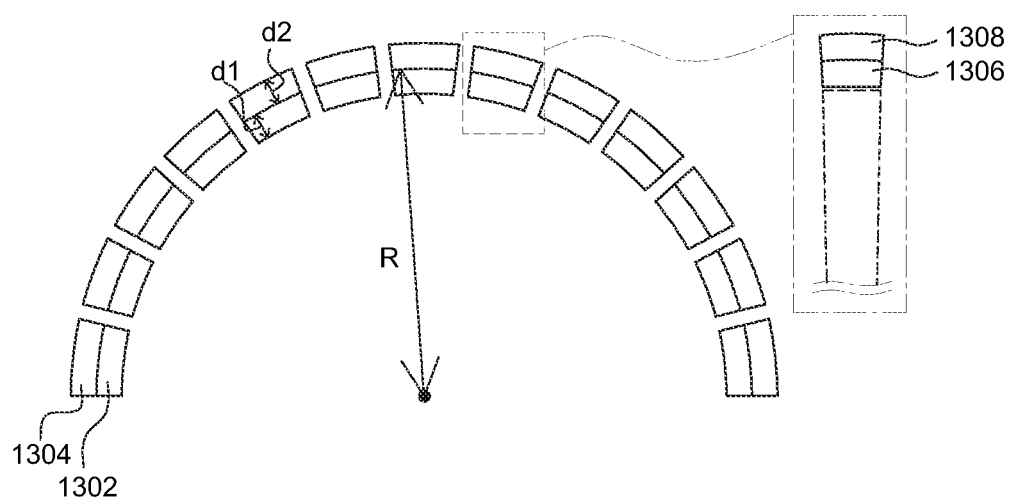
FIG. 13 is a diagram describing stress applied to a second layer when a first layer and a second layer which are adjacent to each other, but divided into a plurality of layers are bent.

FIG. 12 is a diagram describing stress applied to a second layer when a first layer and a second layer which are adjacent to each other and continuous are bent. FIG. 13 is a diagram describing stress applied to a second layer when a first layer and a second layer which are adjacent to each other, but divided into a plurality of layers are bent.

As illustrated in FIG. 12, when continuous second layers 1204 are disposed on continuous first layers 1202, stress $\varepsilon_{top}$ applied to the second layer 1204 may be determined by the following Equation 1. When the stress applied to the second layer 1204 exceeds a predetermined threshold value, the crack is generated in the second layer 1204.

$$\varepsilon_{top} = \left[\frac{d1+d2}{2R}\right]\left[\frac{(1+2\eta+X\eta^2)}{(1+\eta)(1+X\eta)}\right] \quad \text{[Equation 1]}$$

$\eta = d2/d1$, $X = Y2/Y1$, $Y$: Young's modulus

Here, R is the radius of curvature of the first layer 1202, d1 is the thickness of the first layer 1202, d2 is the thickness of the second layer 1204, X is Y2/Y1, Y1 is Young's modulus of the first layer 1202, and Y2 is Young's modulus of the second layer 1204. In Equation 1, it can be seen that depending on the radius of curvature of the second layer 1204, the stress applied to the second layer 1204 is determined.

In the flexible organic light emitting display device in the related art, the planarization layer and the bank layer are disposed on the entire surface of the flexible substrate as one continuous layer. That is, both edge of the planarization layer and the bank layer and the central portion of the planarization layer and the bank layer are connected to each other. Thus, when the flexible organic light emitting display device is bent, the radius of curvature R is relatively increased. Accordingly, large stress is applied to the planarization layer and the bank layer due to repeated bending, and as a result, a crack is generated in the planarization layer and the bank layer with high probability.

However, as illustrated in FIG. 13, when the first layer 1302 and the second layer 1304 are separated from each other, even though the flexible organic light emitting display device is bent with the same radius of curvature R as illustrated in FIG. 13, both edge of the first layer 1302 and the second layer 1304 and the central portion of the first layer 1306 and the second layer 1308 are separated from each other. As a result, one unit first layer 1306 and one unit second layer 1308 are bent with very large radius of curvature R. Accordingly, even though the bending is repeated, relatively small stress is applied to the first layer 1302 and the second layer 1304 and the crack is generated with lower probability. That is, the hole pattern minimizes the probability of crack being generated due to bending of the flexible substrate and can suppress propagation of the crack.

The above effect may be equally applied even to the flexible organic light emitting display devices 900, 1000, and 1200 illustrated in FIGS. 9A and 11. In other words, in the flexible organic light emitting display devices 900, 1000, and 1200, since at least one of the planarization layers 681, 981, and 1181 and the bank layers 682, 1082, and 1182 are separated from each other on the flexible substrate 210, even though the repeated bending is performed, the relatively small stress is applied to the planarization layers 681, 981, and 1181 or the bank layers 682, 1082, and 1182. Thus, the crack is generated with lower probability.

Figure 14:
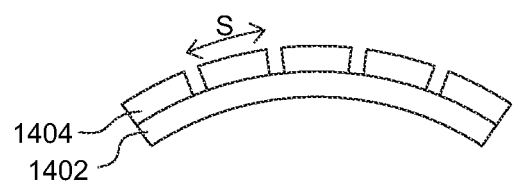
FIG. 14 is a schematic cross-sectional view for describing effects according to the present disclosure.

FIG. 14 is a schematic cross-sectional view for describing effects according to the present disclosure.

As illustrated in FIG. 14, when second layers 1404 separated from each other are disposed on a first layer 1402, a width of a crack generated in the first layer 1402 is proportional to a segment length S of the second layer 1404.

Due to the fact, in the flexible organic light emitting display device in which the bank layer and the planarization layer are disposed on the entire surface of the flexible substrate as one continuous layer, there is a problem in that a crack with a very large width is generated in the bank layer, the planarization layer, and the layers adjacent thereto. The probability of the crack having large width to make damage to the line (e.g., data line and gate line) and the like is higher than that of the crack having small width. Thus, as the crack having large width is generated, such problem is an important cause of deteriorating the reliability of the flexible organic light emitting display device.

However, in the flexible organic light emitting display devices 900, 1000, and 1200 of the present disclosure, at least one of the planarization layers 681, 981, and 1181 and the bank layers 682, 1082, and 1182 are disposed on the flexible substrate 210 to be separated from each other. Thus, even though cracks are generated in the planarization layers 681, 981, and 1181 or the bank layers 682, 1082, and 1182, and the layers adjacent thereto, widths of the cracks are decreased. Accordingly, possibility of the damage to the line and the like due to the crack caused by the repeated bending may be decreased.

In addition, in the organic light emitting display device in the related art, the bank layer and the planarization layer are not disposed on the entire surface of the flexible substrate to be separated from each other, but they are disposed as one continuous layer. Likewise, there is a problem in that the crack generated in a part of the bank layer and the planarization layer is easily propagated to the organic light emission layer or the thin film transistor according to the continuous banking layer and planarization layer.

However, in the flexible organic light emitting display devices 900, 1000, and 1200, since at least one of the planarization layers 681, 981, and 1181 and the bank layers 682, 1082, and 1182 are disposed on the flexible substrate 210 to be separated from each other, a crack is less likely to be generated in the planarization layers 681, 981, and 1181 or the bank layers 682, 1082, and 1182. In addition, even though a crack is generated in a part of the planarization layers 681, 981, and 1181 or the bank layers 682, 1082, and 1182, a propagation path is blocked at first. Thus, the generated crack may not be easily propagated to organic light emission layers 693a, 693b, and 693c or the thin film transistor TFT. Therefore, the flexible organic light emitting display devices 900, 1000, and 1200 of the present disclosure may have excellent lifespan and reliability.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. The protective scope of the present disclosure should be construed based on the following claims, and all the technical concepts in the equivalent scope thereof should be construed as falling within the scope of the present disclosure.

What is claimed is:

1. A flexible organic light emitting display device, comprising:
 a flexible substrate including a plurality of pixels, each of the plurality of pixels including:
  a circuit area and a display area,
  a thin film transistor disposed on the circuit area,
  an organic light emitting element disposed on the display area and electrically connected to the thin film transistor,
  wherein the display area has a quadrangular shape and is non-overlapping with the circuit area;
 gate lines disposed in a first direction of the flexible substrate;
 data lines disposed in a second direction that is different from and non-parallel to the first direction of the flexible substrate;
 an inorganic insulation layer disposed on the flexible substrate; and
 an organic insulation layer disposed on the inorganic insulation layer,
 wherein the organic light emitting element of each pixel is disposed on the organic insulation layer,
 wherein at least one of the organic insulation layer and the inorganic insulation layer includes a first hole pattern, a second hole pattern, and a third hole pattern,
 wherein the first hole pattern is disposed in the first direction and between the thin film transistor and the organic light emitting element of each pixel,
 wherein the second hole pattern is disposed in the first direction and between the organic light emitting element of each pixel and one of the gate lines adjacent to the organic light emitting element of each pixel,
 wherein the third hole pattern is disposed in the second direction and between each adjacent two of the data lines,
 wherein the first hole pattern, the second hole pattern, and the third hole pattern reduce probability of generation of cracks due to bending of the flexible substrate and suppress propagation of the cracks to minimize a slip between an active layer of the thin film transistor and the inorganic insulation layer, and
 wherein the organic light emitting element of each pixel does not overlap with a gate electrode of the thin film transistor of each pixel.

2. The flexible organic light emitting display device according to claim 1, wherein the thin film transistor includes:
 the gate electrode separated from the active layer and overlapping with the active layer; and
 a source electrode and a drain electrode electrically connected with the active layer, and
 wherein the inorganic insulation layer includes:
  a gate insulation layer insulating the active layer from the gate electrode of the thin film transistor;

an insulating interlayer insulating the source electrode and the drain electrode from the gate electrode, respectively; and a passivation layer covering the thin film transistor, and the first hole pattern, the second hole pattern, and the third hole pattern are disposed on at least one of the gate insulation layer, the insulating interlayer, and the passivation layer.

3. A flexible display device, comprising:

a flexible substrate having a display region, the display region including a matrix of pixels, the matrix of pixels extending in a row direction of the flexible substrate and in a column direction that is different from and non-parallel to the row direction of the flexible substrate, each of the matrix of pixels having:
  a circuit area and a display area,
  a thin film transistor disposed on the circuit area,
  an organic light emitting element disposed on the display area and electrically connected to the thin film transistor,
  wherein the display area displays at least a portion of an image,
  wherein the display area has a quadrangle shape and is non-overlapping with the circuit area;
gate lines disposed in the row direction of the flexible substrate;
data lines disposed in the column direction of the flexible substrate, and
a planarization layer and one or more inorganic layers in at least the display region, the one or more inorganic layers comprising a gate insulation layer and an interlayer,
wherein at least one of the gate insulation layer, the interlayer, and the planarization layer includes a hole pattern that is positioned around the circuit area of each pixel, the hole pattern serving a dual purpose of minimizing formation of cracks that affect each pixel while allowing for repeated bending or folding of the display region,
wherein the organic light emitting element of each pixel does not overlap with a gate electrode of the thin film transistor of each pixel,
wherein the hole pattern includes a first hole pattern, a second hole pattern, and a third hole pattern,
wherein the first hole pattern is disposed in the row direction and between the circuit area and the display area of each pixel,
wherein the second hole pattern is disposed in the row direction and between the organic light emitting element of each pixel and one of the gate lines adjacent to the organic light emitting element of each pixel, and
wherein the third hole pattern is disposed in the column direction and between each adjacent two of the data lines.

4. A flexible thin film transistor substrate, comprising:

a flexible substrate having a display region, the display region including a plurality of pixels, each of the plurality of pixels including:
  a circuit area and a display area,
  a thin film transistor disposed on the circuit area,
  an organic light emitting element disposed on the display area and electrically connected to the thin film transistor,
  wherein the display area has a quadrangular shape and is nonoverlapping with the circuit area;
gate lines disposed in a first direction of the flexible substrate;
data lines disposed in a second direction that is different from and non-parallel to the first direction of the flexible substrate; and
a planarization layer and one or more inorganic layers in at least the display region, the one or more inorganic layers comprising a gate insulation layer and an interlayer,
wherein at least one of the gate insulation layer, the interlayer, and the planarization layer includes a first hole pattern, a second hole pattern, and a third hole pattern,
wherein the first hole pattern is disposed in the first direction and between the thin film transistor and the organic light emitting element of each pixel,
wherein the second hole pattern is disposed in the first direction and between the organic light emitting element of each pixel and one of the gate lines adjacent to the organic light emitting element of each pixel,
wherein the third hole pattern is disposed in the second direction and between each adjacent two of the data lines,
wherein the first hole pattern, the second hole pattern, and the third hole pattern surround the thin film transistor of each pixel, and the first hole pattern, the second hole pattern, and the third hole pattern each are configured to reduce bending stress generated by bending the flexible substrate, reduce a slip between an active layer of the thin film transistor of each pixel and the gate insulation layer and minimize formation of cracks that affect the plurality of pixels while allowing for repeated bending or folding of the display region,
wherein the third hole pattern is intersected with the first hole pattern and the second hole pattern, and
wherein the first hole pattern does not overlap with the thin film transistor.

5. The flexible thin film transistor substrate according to claim 4, wherein the first hole pattern, the second hole pattern, and the third hole pattern are disposed in both the gate insulation layer and the interlayer.

6. The flexible thin film transistor substrate according to claim 5, further comprising:

a passivation layer covering the interlayer, a source electrode of the thin film transistor, and a drain electrode of the thin film transistor.

7. The flexible thin film transistor substrate according to claim 6, wherein the first hole pattern, the second hole pattern and the third hole pattern are further disposed in the passivation layer.

8. The flexible thin film transistor substrate according to claim 7, wherein the one or more inorganic layers further comprise the passivation layer.

9. The flexible thin film transistor substrate according to claim 4, wherein the first hole pattern, the second hole pattern, and the third hole pattern surround the circuit area of each pixel.

10. The flexible thin film transistor substrate according to claim 9, wherein the third hole pattern is extended in a direction parallel to a folding line in which the flexible substrate is folded.

* * * * *